(12) United States Patent
Suehira et al.

(10) Patent No.: US 7,884,935 B2
(45) Date of Patent: Feb. 8, 2011

(54) PATTERN TRANSFER APPARATUS, IMPRINT APPARATUS, AND PATTERN TRANSFER METHOD

(75) Inventors: Nobuhito Suehira, Kawasaki (JP); Junichi Seki, Yokohama (JP); Hideki Ina, Tokyo (JP); Koichi Sentoku, Tochigi-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 771 days.

(21) Appl. No.: 11/736,696

(22) Filed: Apr. 18, 2007

(65) Prior Publication Data

US 2007/0242272 A1    Oct. 18, 2007

(30) Foreign Application Priority Data

Apr. 18, 2006  (JP)  ............................. 2006-114093
Nov. 10, 2006  (JP)  ............................. 2006-305310
Feb. 16, 2007  (JP)  ............................. 2007-036598

(51) Int. Cl.
| | |
|---|---|
| G01B 11/00 | (2006.01) |
| G01B 15/00 | (2006.01) |
| G01N 21/86 | (2006.01) |
| G01V 8/00 | (2006.01) |
| B41F 1/34 | (2006.01) |
| B41F 21/12 | (2006.01) |
| B41F 21/14 | (2006.01) |
| B41L 1/02 | (2006.01) |
| B29C 45/76 | (2006.01) |
| B29C 35/08 | (2006.01) |
| B29C 35/12 | (2006.01) |
| B29C 47/92 | (2006.01) |
| B29C 47/96 | (2006.01) |
| B29B 13/00 | (2006.01) |
| B29B 15/00 | (2006.01) |
| B28B 17/00 | (2006.01) |

(52) U.S. Cl. .................... 356/401; 250/548; 250/559.3; 101/485; 264/40.5; 264/406; 425/150

(58) Field of Classification Search ....................... None
See application file for complete search history.

(56) References Cited

U.S. PATENT DOCUMENTS 3,712,740 A * 1/1973 Hennings ................. 356/152.2

(Continued)

FOREIGN PATENT DOCUMENTS

| JP | 10-335241 | 12/1998 |
|---|---|---|
| WO | WO 2006/024908 A2 | 3/2006 |

OTHER PUBLICATIONS

European Search Report dated Jan. 8, 2008, issued in corresponding European patent application No. EP 07 10 6423, forwarded in a Communication dated Feb. 1, 2008.

(Continued)

*Primary Examiner*—Tarifur Chowdhury
*Assistant Examiner*—Gordon J Stock, Jr.
(74) *Attorney, Agent, or Firm*—Fitzpatrick, Cella, Harper & Scinto

(57) ABSTRACT

A pattern transfer apparatus transfers an imprint pattern formed on a mold, provided with an alignment mark, to a resin material on a substrate, provided with an alignment mark. A first image pickup device obtains an image of an object positioned at a first object position. A second image pickup device obtains an image of an object positioned at a second object position. The second object position is more distant from the alignment mark of the mold than the first object position. An optical system forms an image of an object positioned at the first object position and an image of an object positioned at the second object position. Alignment is performed based on first and second information obtained about positions of images of an alignment mark of a reference substrate and an alignment mark of the substrate, to transfer the imprinting pattern to the resin material.

9 Claims, 12 Drawing Sheets

| | | | | | | |
|---|---|---|---|---|---|---|
| 5,333,050 | A | 7/1994 | Nose et al. ............... 356/356 | 7,173,716 B2 | 2/2007 | Oishi et al. ............... 356/620 |
| 5,369,486 | A | 11/1994 | Matsumoto et al. ......... 356/349 | 7,247,868 B2 | 7/2007 | Suzuki et al. .......... 250/492.22 |
| 5,465,148 | A | 11/1995 | Matsumoto et al. ......... 356/349 | 7,271,882 B2 | 9/2007 | Ina et al. ..................... 356/72 |
| 5,550,635 | A | 8/1996 | Saitoh et al. ............... 356/401 | 7,418,902 B2 * | 9/2008 | Kruijt-Stegeman et al. .. 101/485 |
| 5,585,923 | A | 12/1996 | Nose et al. ............... 356/363 | 7,531,821 B2 * | 5/2009 | Suehira et al. ........... 250/559.3 |
| 5,625,453 | A | 4/1997 | Matsumoto et al. ......... 356/351 | 7,618,250 B2 * | 11/2009 | Van Santen et al. ......... 425/171 |
| 5,717,492 | A | 2/1998 | Sentoku et al. ............ 356/401 | 7,745,237 B2 * | 6/2010 | Katagiri et al. ............... 438/14 |
| 5,751,426 | A | 5/1998 | Nose et al. ............... 356/356 | 2001/0046315 A1 | 11/2001 | Sentoku et al. ............. 382/151 |
| 5,808,742 | A * | 9/1998 | Everett et al. ............... 356/509 | 2003/0062334 A1* | 4/2003 | Lee et al. ..................... 216/37 |
| 5,847,974 | A | 12/1998 | Mori et al. ............. 364/571.02 | 2004/0021254 A1 | 2/2004 | Sreenivasan et al. ........ 264/406 |
| 6,154,281 | A | 11/2000 | Sentoku et al. ............ 356/401 | 2006/0050274 A1 | 3/2006 | Matsumoto et al. ......... 356/401 |
| 6,421,124 | B1 | 7/2002 | Matsumoto et al. ......... 356/401 | 2006/0279004 A1* | 12/2006 | Suehira et al. ............. 257/797 |
| 6,529,625 | B2 | 3/2003 | Sentoku et al. | 2007/0266875 A1* | 11/2007 | Berge ....................... 101/481 |
| 6,559,924 | B2 | 5/2003 | Ina et al. ..................... 355/53 | | | |
| 6,628,392 | B2 | 9/2003 | Kuroda et al. ............... 356/400 | | | |
| 6,696,220 | B2 | 2/2004 | Bailey et al. | | | |
| 6,950,179 | B2 | 9/2005 | Ina et al. ..................... 356/73 | | | |
| 6,992,767 | B2 | 1/2006 | Matsumoto et al. ......... 356/401 | | | |
| 6,992,780 | B2 | 1/2006 | Sentoku et al. ............. 356/620 | | | |
| 7,035,759 | B2 | 4/2006 | Oishi et al. ................. 702/150 | | | |
| 7,067,826 | B2 | 6/2006 | Suzuki et al. ............ 250/491.1 | | | |
| 7,110,116 | B2 | 9/2006 | Oishi et al. ................. 356/401 | | | |
| 7,148,973 | B2 | 12/2006 | Sentoku et al. ............. 356/620 | | | |

OTHER PUBLICATIONS

Brubaker, Chad, et al. "Thick Resist Alignment Technology for MEMS and Advanced Packaging," Prcoeedings of the SPIE—The International Society For Optical Engineering—Int. Soc. Opt. Eng. USA, vol. 5037, (2003), pp. 1059-1065.

Stephen Y. Chou, et al., "Imprint of Sub-25 nm Vias and Trenches in Polymers",vol. 67, Nov. 20, 1995, pp. 3114-3116.

* cited by examiner

PATTERN TRANSFER APPARATUS, IMPRINT APPARATUS, AND PATTERN TRANSFER METHOD This application claims priority from Japanese Patent Application No. 2006-114093, filed Apr. 18, 2006, No. 2006-305310, filed Nov. 10, 2006, and No. 2007-036598, filed Feb. 16, 2007, which are hereby incorporated by reference.

FIELD OF THE INVENTION AND RELATED ART

The present invention relates to a pattern transfer apparatus, an imprint apparatus, and a pattern transfer method. Particularly, the present invention relates to these apparatuses and methods for transferring a shape of a mold onto a member to be processed to effect processing.

In recent years, as described in Appl. Phys. Lett., Vol. 67, Issue 21, pages 3114-3116 (1995) by Stephan Y. Chou, et al., a fine processing technology for pressure-transferring a fine structure provided on a mold onto a work (or workpiece), such as a semiconductor, glass, resin, or metal, has been developed and has received attention. This technology is called nanoimprint or nanoembossing, since it has a resolving power on the order of several nanometers. In addition to semiconductor manufacturing, the technology is capable of effecting simultaneous processing of a three-dimensional structure at a wafer level. For this reason, the technology has been expected to be applied to a wide variety of fields, such as manufacturing technologies, and the like, for optical devices, such as photonic crystals, and the like, µ-TAS (micro total analysis systems), biochips, etc.

A case wherein such a nanoimprint, e.g., an optical imprint method, is used in semiconductor fabrication will be described below.

First, on a substrate (e.g, a semiconductor wafer), a layer of a photocurable resin material is formed. Next, against the resin layer, a mold on which a desired imprint pattern is formed is pressed, followed by irradiation with ultraviolet rays to cure the photocurable resin material. As a result, the imprint structure is transferred onto the resin layer. Then, etching, or the like, with the resin layer as a mask is effected, to transfer the imprint structure onto the substrate.

Incidentally, in the semiconductor manufacturing, it is necessary to effect (positional) alignment of the mold with the substrate. For example, in such a current circumstance that a semiconductor process rule is not more than 100 nm, a tolerance of an alignment error due to an apparatus is such a severe degree that it is said to be several nanometers to several tens of nanometers.

As such, an alignment method, e.g., U.S. Pat. No. 6,696,220 has proposed a method in which a mold and a substrate are caused to contact each other, in a state in which a resinous material is interposed therebetween, to effect alignment. In this method, first, a photocurable resin material is selectively applied to a portion of the substrate other than a mark provided to the substrate. Next, the substrate is moved to a position opposite to the mold. In this state, a distance between the mode and a work (the substrate provided with the photocurable material) is decreased, so that the mold is caused to come near to such a distance that the mark is not filled with the resin material. In the method, the alignment is effected in this state and, thereafter, final pressure application is performed. In the method, an optical system employs such an observation method that only a portion having a small depth of focus in the neighborhood of the mark of the mold is observed.

As a method of effecting alignment of two objects to be aligned in a separation state therebetween, e.g., a method using two image pickup devices, as described in Japanese Laid-Open Patent Application (JP-A) Hei 10-335241, has been proposed.

In this method, when relative position detection of a mask as a first object and a wafer as a second object is effected, a third object to which two separate reference alignment marks are provided at both surfaces of the third object, which face position detection marks provided on the first and second objects, respectively, is disposed on an illumination optical system side. The method is constituted so that optical images of the reference alignment marks on the third object and position detection marks on the first and second objects are detected by the image pickup devices, to detect positional deviation between the first object and the second object.

In the case of the alignment of the mold with the substrate, when alignment in an in-plane direction is effected in a direct or an indirect contact state between the mold and the substrate, the mold and substrate can be adversely affected.

For example, in the case wherein a large positional deviation between the mold and the substrate is caused to occur in the method as described in U.S. Pat. No. 6,696,220, in which the alignment is effected only in such a state that the mold and the substrate contact each other via the resin material, when the mold and the substrate are moved largely at a high speed, a possibility of breakage of the mold and the substrate is further increased. On the other hand, if the alignment can be effected in a separation state between the mold and the substrate, the mold and the substrate are not broken, to further decrease a degree of the positional deviation therebetween, after the mold contacts the resin material. As a result, it is possible to effect high-speed alignment.

When the alignment is effected in such a separation state, in the method as described in JP-A Hei 10-335241, the illumination optical system is complicated, and a third object requiring high-accuracy patterns on both surfaces thereof, is needed.

SUMMARY OF THE INVENTION

In view of the above-described problems, a principal object of the present invention is to provide a pattern transfer apparatus and an imprint apparatus, which are capable of effecting alignment at high speed.

Another object of the present invention is to provide a pattern transfer method capable of effecting high-speed alignment.

According to an aspect of the present invention, a pattern transfer apparatus for transferring an imprinting pattern formed on a mold, provided with an alignment mark, onto a substrate provided with an alignment mark, or a resin material interposed between the substrate and the mold, comprises:

first image pickup means for obtaining an image at a first object position; and second image pickup means for obtaining an image at a second object position spaced apart from the first object position, wherein the alignment mark of the mold and the alignment mark of the substrate or an alignment mark of a reference substrate are positionable at the first object position, and the alignment mark of the substrate or the reference substrate is positionable at the second object position, wherein the alignment marks positioned at the first and second object positions are observed through the first and second image pickup means to obtain information about a difference in image position between the alignment marks observed through the first and second image pickup means, and wherein alignment between the mold and the substrate in an in-plane direction is effected on the basis of the obtained information, to transfer the imprinting pattern onto the substrate or the resin material.

In the pattern transfer apparatus according to the present invention, the information about the difference in image position may preferably be obtained by comparing an image of the reference substrate at the first object position with an image of the reference substrate at the second object position. Further, a distance between the first object position and the second object position may preferably be equal to or more than a distance at which the substrate and the imprinting pattern formed on the mold indirectly contact each other through the resin material. In a preferred embodiment, the reference substrate is provided with an alignment mark at a surface thereof facing the substrate and an alignment mark at a surface thereof facing the mold, and has a thickness equal to the distance between the first object position and the second object position. The alignment mark provided to the reference substrate may preferably be disposed in an area having a size equal to that of a pattern area of the mold. The reference substrate may preferably be constituted by the substrate itself onto which the imprinting pattern formed on the mold is to be transferred. In the pattern transfer apparatus of the present invention, the imprinting pattern may preferably be transferable onto the substrate or the resin material, by effecting alignment between the mold and the substrate in an in-plane direction at the second object position and causing the aligned mold and substrate to contact each other directly or indirectly through the resin material. The pattern transfer apparatus may preferably further comprise a light amount adjusting mechanism for adjusting an amount of light entering the first and second image pickup means. The light amount adjusting mechanism may preferably be constituted so that the amount of light is adjustable in a plurality of areas of the first and second image pickup means.

According to another aspect, the present invention provides a pattern transfer method for transferring an imprinting pattern formed on a mold provided with an alignment mark onto a substrate provided with an alignment mark or a resin material interposed between the substrate and the mold. The pattern transfer method includes a first step for obtaining a first image by disposing the alignment mark provided to the mold and an alignment mark provided to a reference substrate at a first object position and observing the alignment marks through a first image pickup portion, a second step for obtaining a second image by disposing the alignment mark provided to the reference substrate at a second object position spaced apart from the first object position and observing the alignment mark through a second image pickup portion, and third step for obtaining information about a difference in image position between the alignment marks by using the first and second images. In the pattern transfer method of the present invention, in the first step, alignment between the mold and the reference substrate may, preferably, be effected. Further, between the first step and the second step, a position of the reference substrate in its in-plane direction may, preferably, be kept. In the third step, the information about the difference in image position may, preferably, be obtained by comparing the second image with the alignment mark of the reference substrate disposed at the second object position. In the pattern transfer method of the present invention, the alignment mark provided to the reference substrate may, preferably, be disposed in an area having a size equal to that of a pattern area of the mold. Further, the reference substrate may, preferably, be constituted by the substrate itself onto which the imprinting pattern formed in the mold is to be transferred. The pattern transfer method may, preferably, further comprise, after the third step, a fourth step for transferring the imprinting pattern onto the substrate or the resin material by causing the mold and the substrate to contact each other, directly or indirectly through the resin material, to effect alignment between the mold and the substrate at the first object position. When the imprinting pattern is transferred onto the substrate or the resin material by causing the mold and the substrate to contact each other directly or indirectly through the resin material, the alignment between the mold and the substrate may, preferably, be effected while decreasing a distance between the mold and the substrate or the resin material from the second object position spaced apart from the first object position, thereby to effect the transfer of the imprinting pattern. Further, when the information about the difference in image position between the alignment marks is obtained by using the first and second images, the third step may, preferably, include a process for selecting a plurality of areas from the first and second images obtained by the first and second image pickup portions, a process of effecting first signal processing in each of the plurality of areas, and a process of effecting second signal processing on the basis of a result of the first signal processing. Further, when the information about the difference in image position between the alignment marks is obtained by using the first and second images, the third step may, preferably, include a process in which data obtained by the first and second image pickup portions, by using gratings having different pitches as the alignment marks are overlaid and subjected to signal processing to generate moire fringes and the generated moire fringes are utilized. The above-described light amount adjusting mechanism of the pattern transfer apparatus may, preferably, be used in the pattern transfer method of the present invention to effect light amount adjustment at the first and second image pickup portions. Further, the light amount adjusting mechanism may, preferably, be used to effect light amount adjustment in a plurality of areas of the first and second image pickup portions. In the pattern transfer method of the present invention, the first step may, preferably, include a process of obtaining the first image by observing the alignment marks through the first image pickup portion at a first amount of light and the second step may, preferably, include a process of obtaining the second image by observing the alignment mark through the second image pickup portion at a second amount of light. Further, before the process of effecting first signal processing in each of the plurality of areas in the third step, correction of magnification may, preferably, be made, depending on a change in height of the mode or the substrate.

According to a further aspect, the present invention provides a pattern transfer apparatus for transferring an imprinting pattern formed on a mold onto a substrate or a resin material interposed between the substrate and the mold. The pattern transfer apparatus may, preferably, comprise a first image pickup portion for obtaining an image at a first depth of focus, and a second image pickup portion for obtaining an image at a second depth of focus, wherein a first alignment mark provided to the mold and a second alignment mark provided to the substrate are disposed within the first depth of focus and observed through the first image pickup portion to obtain a first image, wherein a third alignment mark provided to the mold or the substrate is disposed within the second depth of focus and observed through the second image pickup portion to obtain a second image, and wherein information about a difference in observation range between the first and second image pickup portions is obtained by using the first and second images.

According to a further aspect, the present invention provides an alignment apparatus for effecting alignment between a substrate provided with an alignment mark and a plate-like object provided with an alignment mark. The alignment apparatus may, preferably, comprise a first image pickup means for obtaining an image at a first object position, and a second image pickup means for obtaining an image at a second position spaced apart from the first object position, wherein the alignment mark of the plate-like object and the alignment mark of the substrate or an alignment mark of a reference substrate are positionable at the first object position, and the alignment mark of the substrate or the reference substrate is positionable at the second object position, wherein the alignment marks positioned at the first and second object positions are observed through the first and second image pickup means, to obtain information about a difference in image position between the alignment marks observed through the first and second image pickup means, and wherein alignment between the plate-like object and the substrate in an in-plane direction is effected on the basis of the obtained information.

According to a further aspect, the present invention provides an alignment method for effecting alignment between a substrate provided with an alignment mark and a plate-like object provided with an alignment mark. The alignment method may preferably comprise a first step for obtaining a first image by disposing the alignment mark provided to the plate-like object and an alignment mark provided to a reference substrate at a first object position, and observing the alignment marks through a first image pickup portion, a second step for obtaining a second image by disposing the alignment mark provided to the reference substrate at a second object position spaced apart from the first object position, and observing the alignment mark through a second image pickup portion, and a third step for obtaining information about a difference in image position between the alignment marks by using the first and second images.

According to a further aspect, the present invention provides an alignment method for effecting alignment between a first member provided with a first alignment mark and a second member provided with a second alignment mark, particularly, an alignment with respect to an in-plane direction between two members disposed opposite to each other. In the alignment method, first, a first image pickup portion for observing an object at a first object position and a second image pickup portion for observing an object at a second object position, spaced apart from the first object position, are prepared. Next, information about a difference in an observation range between the first image pickup portion and the second image pickup portion are obtained. The information may, e.g., be information about a degree of mutual deviation between centers of the observation positions to be observed by the first and second image pickup portions, respectively. Then, alignment between the first member and the second member is effected while the information is used in a state in which the first alignment mark of the first member and the second alignment mark of the second member are disposed so as to be observable by the first image pickup portion and the second image pickup portion, respectively. As a result, it is possible to effect strict in-plane alignment between the two members in a state in which the two members are spaced apart from each other at a predetermined distance. It is also possible to decrease a distance between the first member and the second member after the alignment is effected in the state in which the first alignment mark of the first member and the second alignment mark of the second member are disposed, so as to be observable by the first image pickup portion and the second image pickup portion, respectively. Further, the two members may be caused to contact each other. The alignment method described above is applicable not only to an imprint apparatus, but also, to various apparatuses requiring positional adjustment.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 7A to 7F are schematic views for illustrating alignment marks in Embodiment 3, wherein FIG. 7A is a view for illustrating a first alignment mark for uniaxial measurement, FIG. 7B is a view for illustrating a second mark for uniaxial measurement, FIG. 7C is a view for illustrating a composite image for uniaxial measurement, FIG. 7D is a view for illustrating a first alignment mark for XYθ measurement, FIG. 7E is a view for illustrating a second alignment mark for XYθ measurement, and FIG. 7F is a view for illustrating a composite image for XYθ measurement.

FIGS. 8A to 8B are schematic views for illustrating a measurement optical system in Embodiment 4 of the present invention, wherein FIG. 8A is a view for illustrating a constitution in which light entering an image pickup device is adjusted by an optical device, and FIG. 8B is a view for illustrating a constitution in which light, which reaches respective positions of an image pickup device, is adjusted by an optical device.

FIGS. 9A to 9B are schematic views for illustrating a measurement optical system in Embodiment 4, wherein FIG. 9A is a view for illustrating a constitution in which light is adjusted by a light amount control apparatus, and FIG. 9B is a view for illustrating a constitution in which light is adjusted by a rotary shutter.

FIGS. 10A to 10D are schematic views for illustrating marks used in Embodiment 4, wherein FIG. 10A shows a mold mark, FIG. 10B shows a substrate mark, FIG. 10C shows a mold mark having a periodic structure, and FIG. 10D shows a substrate mark having a periodic structure.

FIGS. 11A to 11B are flow charts for illustrating a signal processing method in Embodiment 4, wherein FIG. 11A is a flow chart for illustrating a case wherein magnification correction is not effected, and FIG. 11B is a flow chart for illustrating a case wherein magnification correction is effected.

DETAILED DESCRIPTION OF THE PREFERRED EMBODIMENTS

Figure 1A:
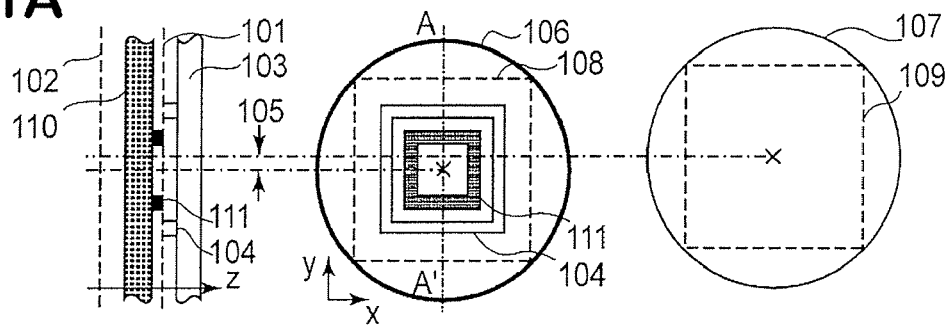
FIGS. 1A to 1D are schematic views for illustrating a method of alignment between a mold and a substrate by means of a reference substrate in Embodiment 1 of the present invention, wherein FIG. 1A includes views for illustrating a case wherein observation is made in a state in which the reference substrate is disposed at a first object position, FIG. 1B includes views for illustrating a case wherein observation is made in a state in which the reference substrate is disposed at a second object position, FIG. 1C includes views for illustrating a case wherein observation is made in a state in which the substrate is disposed at the second object position, and FIG. 1D includes views for illustrating a case wherein observation is made in a state in which the substrate is disposed at the first object position.

By the above-described constitutions, the objects of the present invention can be accomplished. This is based on findings of constitutions for obtaining information about a difference in an observation image between the respective image pickup devices (or image pickup portions) as a result of studies by the present inventors, in order to realize a novel pattern transfer. More specifically, by employing such a constitution that a mold and the substrate are positionally aligned with each other by utilizing the reference substrate during nanoimprint, alignment between the mold and the substrate can be effected more inexpensively. The use of the constitutions of the present invention is not limited to a case wherein the imprinting pattern is transferred onto the substrate itself, but may also be applicable to a case wherein the pattern transfer is effected via the resin material interposed between the mold and the substrate.

In an embodiment of the present invention, in order to realize a processing apparatus through the above-described pattern transfer, it is possible to employ the following constitutions.

More specifically, it is possible to employ a constitution in which an optical system for observing a first object position at a processing surface of the mold and a second object position at a portion closer, than the processing surface, to a member to be processed, is used, and alignment between the mold and the member to be processed is effected by using a means for recognizing a relative relationship of (or a difference in) observation position between a first image pickup device for observing the first object position and a second image pickup device for observing the second object position. In this case, it is possible to employ a constitution in which the reference substrate is used as the means for recognizing the difference in observation position. Further, it is possible to employ a constitution in which the alignment between the mold and the member to be processed is effected by comparing data obtained in advance by the first and second image pickup devices with data (currently) obtained by the first and second image pickup devices. Further, it is also possible to employ a constitution in which the alignment between the mold and the member to be processed is effected by making a comparison in each of several areas in image pickup ranges of the first and second image pickup devices.

Further, in order to realize a processing method by the above-described pattern transfer, it is possible to employ the following constitutions.

In the processing method, an optical system, for observing a first object position at a processing surface of the mold and a second object position at a portion closer to the member to be processed with respect to the processing surface of the mold, is used. The processing method can be constituted so that alignment between the mold and the member to be processed is effected by using a means for recognizing a relative relationship of (or a difference in) observation position between a first image pickup device for observing the first object position and a second image pickup device for observing the second object position. In this case, it is possible to employ a constitution in which the reference substrate is used as the means for recognizing the difference in observation position. Further, it is possible to employ a constitution in which the processing method includes a step of recognizing the difference in observation position by the reference substrate and a step of effecting the alignment between the member to be processed and the mold at the second object position. Further, it is possible to employ a constitution in which the alignment between the mold and the member to be processed is effected by comparing data obtained in advance by the first and second image pickup devices with data (currently) obtained by the first and second image pickup devices. Further, it is possible to employ a constitution in which the processing method includes a step of selecting a plurality of areas from an image obtained by the first image pickup device, a step of effecting first signal processing in each of the plurality of areas, and a step of effecting second signal processing on the basis of a result of the first signal processing. Further, it is possible to employ a constitution in which the data obtained by the first and second image pickup devices by using a grating having different pitches as marks for the alignment described above are overlaid or superposed, and subjected to signal processing to generate moire fringes, and the generated moire fringes are utilized.

In the above-described embodiments of the present invention, a relative positional relationship between the respective image pickup ranges at two (first and second) object positions is measured or determined with the reference substrate by using the optical system for observing coaxially the two object positions of the mold and the substrate. By utilizing a result of the measurement, it is possible to effect the alignment between the mold and the substrate. As a result, the alignment can be effected in a separation state between the mold and the substrate, so that it is possible to effect the alignment between the mold and the substrate at high speed without damage to the mold and the substrate. Further, by disposing the marks for the mold and the substrate in different areas, as seen in a normal direction, interference between the marks for the mold and the substrate does not occur. As a result, the signal processing becomes easy.

Further, the pattern transfer apparatus according to the present invention can also be constituted as described below. Herein, the apparatus means a pattern transfer apparatus for transferring the imprinting pattern formed on the mold onto the substrate or the resin material interposed between the substrate and the mold. The pattern transfer apparatus includes a first image pickup portion for obtaining an image at a first depth of focus and a second image pickup portion for obtaining an image at a second depth of focus. A first alignment mark provided to the mold and a second alignment mold provided to the substrate are disposed within the first depth of focus and observed through the first image pickup portion to obtain a first image. Further, a third mark provided to the mold or the substrate is disposed within the second depth of focus and observed through the second image pickup portion to obtain a second image. The pattern transfer apparatus is constituted so as to obtain information about a difference in observation range between the first and second image pickup portions by using the first and second images. The third alignment mark may be identical to or different from the first alignment mark or the second alignment mark.

Further, it is also possible to effect the alignment between the mark and the substrate (onto which the imprinting pattern is to be transferred) in an in-plane direction in a state in which the alignment mark for the mold is disposed within the first depth of focus and the alignment mark for the substrate is disposed within the second depth of focus. It is further possible to effect the alignment between the mold and the substrate in the in-plane direction in a state in which the alignment mark for the mold is disposed within the second depth of focus and the alignment mark for the substrate is disposed within the first depth of focus.

Hereinbelow, the present invention will be described more specifically based on Embodiments with reference to the drawings.

Embodiment 1

In Embodiment 1, an alignment method of the mold and the substrate in the present invention will be described.

FIGS. 1A to 1D are schematic views for illustrating the alignment method, in this embodiment, of the mold and the substrate in which the reference substrate is used.

Referring to FIGS. 1A to 1D, reference numeral 101 represents a first object position, reference numeral 102 represents a second object position, reference numeral 103 represents a mold, and reference numeral 104 represents a mold mark. Further, reference numeral 110 represents a reference substrate, reference numeral 111 represents a reference substrate mark, reference numeral 112 represents a substrate, and reference numeral 113 represents a substrate mark.

In the alignment method of this embodiment, an optical system for observing the first object position 101 at a processing surface of the mold 103 and the second objection position 102 located in the substrate 112 side with respect to the processing surface is used. By the optical system, the mold mark 104 and the substrate mark 113 are observable at the same time.

The first object position 101 and the second object position 102 are spaced, e.g., several nanometers or more apart, so that the mold and the substrate are in a non-contact positional relationship even when the substrate is moved at high speed in an in-plane direction parallel to the processing surface.

In each of FIGS. 1A to 1D, a central view shows a first observation range 106 at the first object position 101. Further, a right-hand view shows a second observation range 107 at the second object position 102. The first observation range 106 includes a first image pickup range 108 as a portion for image pickup, and the second observation range 107 includes a second image pickup range 109 as a portion for image pickup. Further, a left-hand view shows a cross section of the mold 103 and the reference substrate 110 or the substrate 112, taken along a vertical bisecting line, such as A-A' line indicated in the central view of FIG. 1A.

Generally, it is not easy to dispose coaxially the image pickup device for observing these two (first and second) object positions with an accuracy on the order of nanometers, so that a difference in center position between the first observation range 106 and the second observation range 107 is caused to occur. Further, a difference in center position between each observation range and an associated image pickup range is also caused to occur. In addition, there is a difference in center position between the first observation range and the mold mark. Objects to be finally aligned with each other are the mold and the substrate, so that the center of the substrate mark is aligned with the center of the mold mark in this embodiment. For simplicity of explanation, it is assumed that the first observation range and the first image pickup range coincide with each other and the second observation range and the second image pickup range coincide with each other. Even when this assumption is made, generality of explanation is not lost. Further, for simplicity of explanation, it is assumed that the center positions of the first observation range and the second observation range are deviated only in the y-direction. A direction from the second object position toward the first object position is taken as a positive direction of the z-direction.

The alignment method of this embodiment will be briefly described. In the alignment method, the reference substrate 110 is used for the alignment between the mold and the substrate.

A procedure of the alignment method is as follows.

(1) The mold and the reference substrate are aligned at the first object position by using an in-plane moving mechanism (FIG. 1A).

Figure 1B:
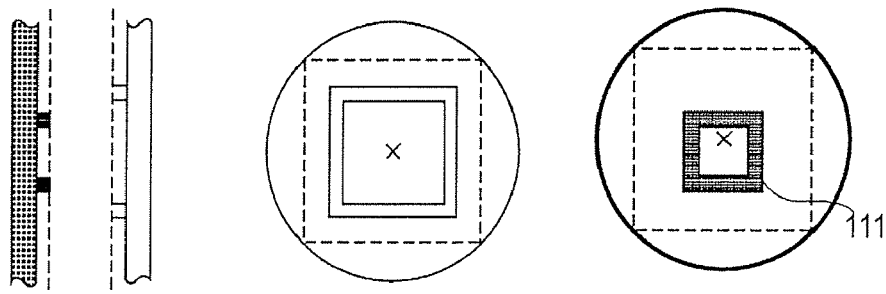

(2) The reference substrate is moved in a negative direction of the z-direction and an image thereof is constituted and obtained at the second object position (FIG. 1B).

Figure 1C:
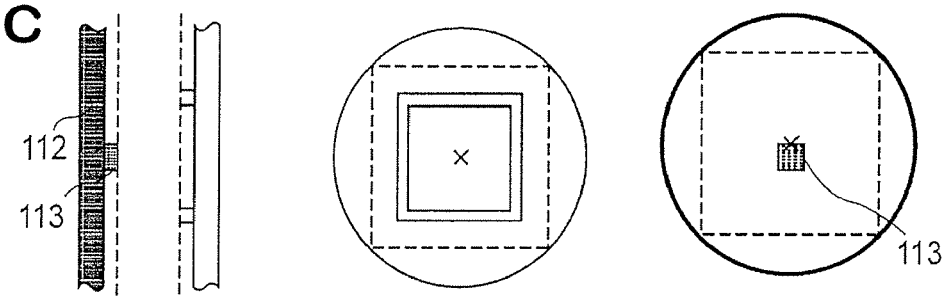

(3) At the second object position, the observed image and the substrate are aligned by using the in-plane moving mechanism (FIG. 1C).

Figure 1D:
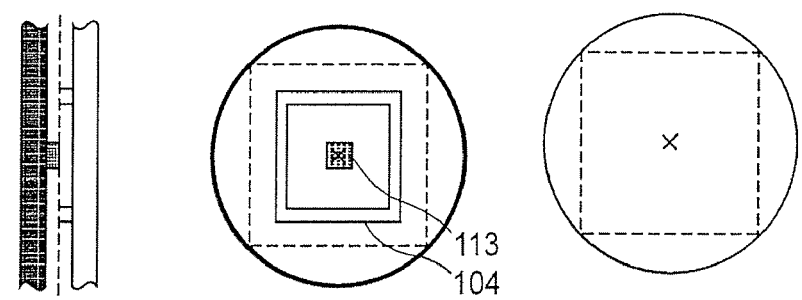

(4) Only by moving the substrate in the positive direction of the Z-direction, is the substrate aligned with the mold at the first object position (FIG. 1D).

In such a step-and-repeat method that a predetermined pattern is repetitively transferred at many points on the same substrate, alignment may be effected only at a first point on the substrate. Thereafter, it is possible to effect repetitive transfer with an accuracy of the in-plane moving mechanism (on the order of subnanometers).

Next, a detailed description will be made.

In order to align the substrate mark with a desired position at the first object position, it is necessary to determine a position, at which the substrate mark should be disposed at the second object position, corresponding to the desired position at the first object position. This operation is, e.g., performed only during replacement of the mold. FIG. 1A shows a state in which the reference substrate mark 111 is caused to correspond to the mold mark at the first object position 101. This state is realized in the following manner. On the assumption that the mold mark 104 is located at the center of the first image pickup range, the substrate is disposed at a substrate holding portion and the center of the reference substrate mark 111 can be caused to correspond to (the center of) the mold mark 104 by using the in-plane moving mechanism. The alignment (positional adjustment) at this time can be effected with an accuracy on the order of nanometers, by using the in-plane moving mechanism. During the alignment, the image at the second object position 102 is not particularly required to be used.

Next, as shown in FIG. 1B, the reference substrate is moved in the negative direction of the Z-direction by using a substrate hoisting and lowering mechanism, so that the reference substrate mark 111 reaches the second object position 102. During this movement, the reference substrate is not deviated in the xy-directions. In the resultant state, the reference substrate mark 111 is observed at the second object position 102, and an image in this state is picked up and stored. At this time, the image at the first object position 101 is not particularly required to be used.

Next, with reference to FIGS. 1C and 1D, the method of the alignment between the mold and the substrate will be described. This operation is performed for every disposition (or placement) of a fresh substrate.

As shown in FIG. 1C, the substrate holding portion holding the substrate 112 is disposed at a designated position (referred to as "F1-1") opposite to the mold 103 by the in-plane moving mechanism. At this time, the substrate mark 113 is observed at the second object position 102. Then, alignment is effected so that the center of the substrate mark 113 is aligned with the center of the reference substrate mark 111 observed at the second object position 102 shown in FIG. 1B, by using the in-plane moving mechanism. This alignment can be effected at high speed, since the mold and the substrate are placed in a separation state. A difference (referred to as "E1-1") between the designated position (F1-1) of the substrate holding portion at this time and a designated position of the substrate holding portion after completion of the alignment (referred to as "S1-1") is stored. In this case, it is not particularly necessary to use the image at the first object position 101.

Next, as shown in FIG. 1D, the substrate 112 is raised in the positive direction of the Z-direction, so that the substrate 112 is disposed at the first object position 101. At this time, the mold and the substrate are basically placed in a completion state of alignment. Thereafter, imprint is effected by setting a designated position on the presumption that there is the difference (deviation) (E1-1) with respect to subsequent transfer onto the same substrate. In this case, it is not particularly necessary to use the image at the second object position 102.

In the case in which the mold and the substrate are deviated from each other and located outside a tolerable range, it is also possible to effect further alignment between the mold and the substrate. This operation may be required, e.g., in the case in which the positions of the mold and the substrate are deviated from each other due to a stress, exerted thereon, caused by the contact between the mold and the substrate via the resin material. In the case in which the positional deviation between the mold and the substrate occurs, when an amount of the deviation between the mold and the substrate is identical, irrespective of the position of the substrate, the following processing is performed. More specifically, a difference (referred to as "E1-2") between the designated position (F1-1) of the substrate holding portion at that time and a position of the substrate holding portion at the time of completion of the alignment (referred to as "S1-2") is stored. In this case, the alignment has already been effected at the second object position, as shown in FIG. 1C, so that a value of the difference (E1-2) is not large. Thereafter, imprint is effected by setting a designated position on the presumption that there is the difference (deviation) (E1-2) with respect to subsequent transfer onto the same substrate.

The above-described alignment is effected on the entire surface of the substrate on the basis of information about the positional deviation between the mold and the substrate, at a certain point of the substrate. However, it is also possible to effect the alignment between the mold and the substrate on the basis of information about positional deviation, at the entire surface of the substrate, obtained in advance of the alignment.

Figure 2A:
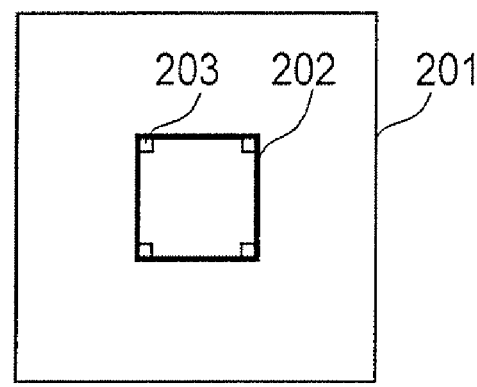
FIGS. 2A to 2C are schematic views for illustrating a constitution of the reference substrate in Embodiment 1.
Figure 2B:
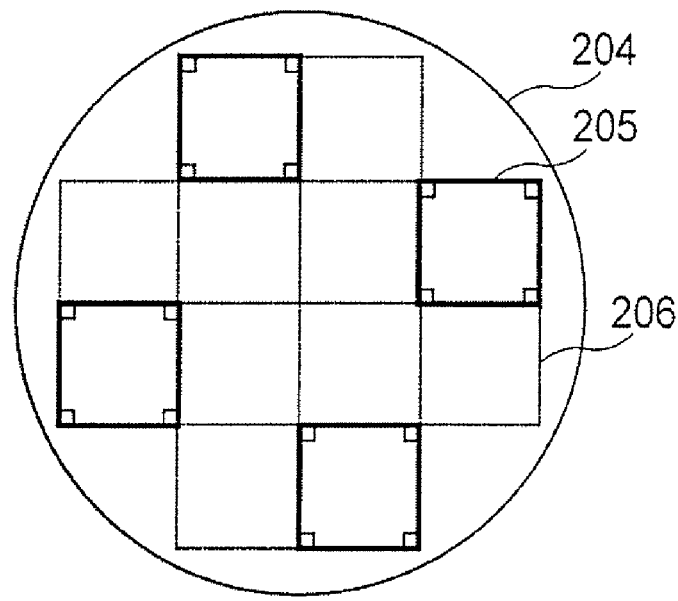
Figure 2C:
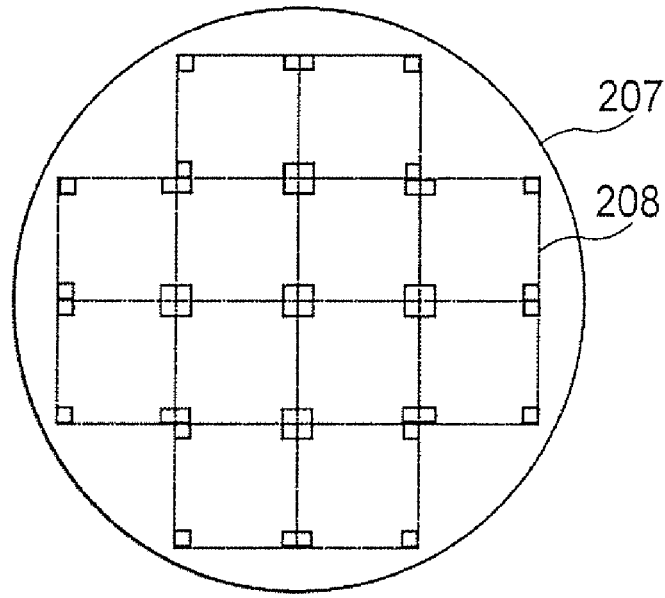

Next, a constitution of the reference substrate used in this embodiment will be described with reference to FIGS. 2A to 2C, showing the constitution of the reference substrate.

As the reference substrate, it is also possible to use the substrate itself onto which the imprinting pattern is to be transferred. However, in this case, there is apprehension that distortion of the substrate during the process and a difference among individual substrates can occur. For this reason, it is desirable that a stable reference substrate is used.

A reference substrate 201, shown in FIG. 2A, has a square shape and is constituted so that an area 202 having a size equal to a pattern area of the mold is disposed on the reference substrate 201, and four reference substrate marks 203 are disposed at four corners of the area 202.

A reference substrate 204, shown in FIG. 2B, has a circular shape, and is constituted so as to have a size equal to that of the substrate onto which the imprinting pattern is to be transferred. On the reference substrate 204, there are a pattern area 205, in which reference substrate marks are provided, and a pattern area 206, in which no reference substrate mark is provided. In this constitution, correction of the positional deviation can be made at several positions at which the reference substrate mark is provided.

A reference substrate 207, shown in FIG. 2C, is constituted by the substrate itself, onto which the imprinting pattern is to be transferred. In this case, the correction may be made at all of the positions in pattern areas 208 or at the several positions shown in FIG. 2B.

Figure 3:
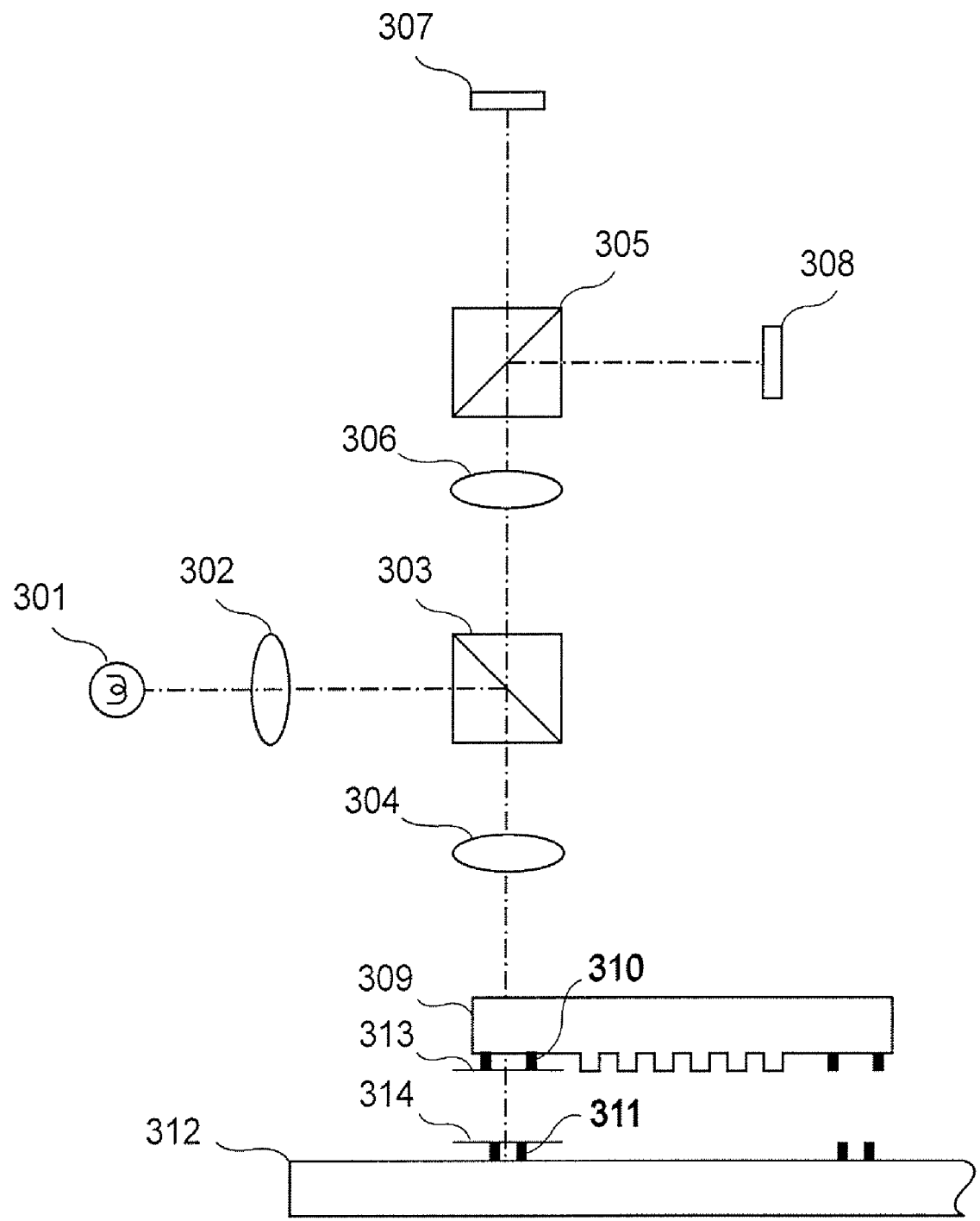
FIG. 3 is a schematic view for illustrating a measurement optical system in Embodiment 1.

Next, an optical system for measurement used in this embodiment will be described with reference to FIG. 3, showing a constitution of the optical system.

In the optical system in this embodiment, light emitted from a light source 301 passes through an illumination optical system 302, a first beam splitter 303, and a first imaging optical system 304, to reach a mold 309 and a substrate 312. Light reflected by the mold 309 and the substrate 312 passes through the first imaging optical system 304, the first beam splitter 303, a second imaging optical system 306, and a second beam splitter 305, to form an image on a first image pickup device 307 and a second image pickup device 308. An image of the first object position 313 is formed on the first image pickup device 307 and a image of the second object position 314 is formed on the first image pickup device 308. In this embodiment, a mold mark 310 is formed as an image on the first image pickup device 307 and a second mark 311 is formed as an image on the second image pickup device 308.

Figure 4:
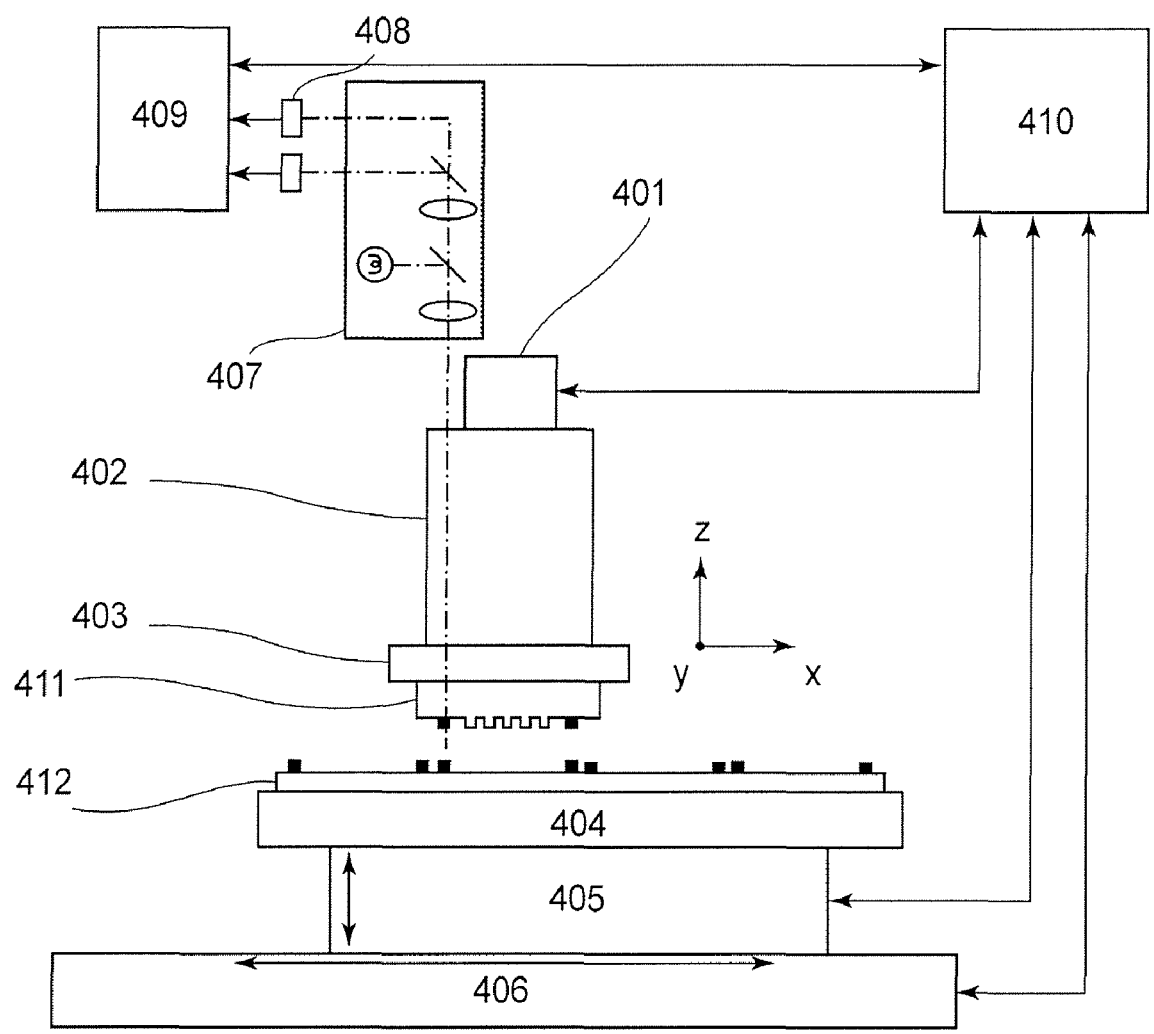
FIG. 4 is a schematic view for illustrating a processing apparatus in Embodiment 1.

Next, a processing apparatus, used in this embodiment, constituting a pattern transfer apparatus for transferring an imprinting pattern formed on a mold onto a substrate or a resin material interposed between the substrate and the mold, will be described with reference to FIG. 4, showing an example of a constitution of the processing apparatus in Embodiment 1.

Referring to FIG. 1, the processing apparatus includes an exposure light source 401, a body tube 402, a mold holding portion 403, a substrate holding portion 404, a substrate hoisting and lowering mechanism (z-direction) 405, an in-plane moving mechanism (xy-directions) 406, an optical system 407 for measurement shown in FIG. 3, image pickup devices 408, and an analyzing mechanism 409.

The mold holding portion 403 effects chucking of a mold 411 according to a vacuum chucking method, or the like. A substrate 412 is movable to a desired position by the in-plane moving mechanism 406. Further, by the substrate hoisting and lowering mechanism 405, adjustment of a height of the substrate 412 and application of pressure can be effected. The in-plane moving mechanism 406 and the substrate hoisting and lowering mechanism 405 are subjected to measurement of distance by an interferometer, or the like, with a control accuracy on the order of subnanometers. Control of positional movement of the substrate, pressure application, exposure, and the like, is made by an imprint control mechanism 410.

Embodiment 2

In Embodiment 2, a method of alignment between the mold and the substrate different from the alignment method of Embodiment 1 will be described.

In this embodiment, explanation of the alignment method common to FIGS. 1A to 1D is omitted, and only a different constitution thereof will be described.

Figure 5A:
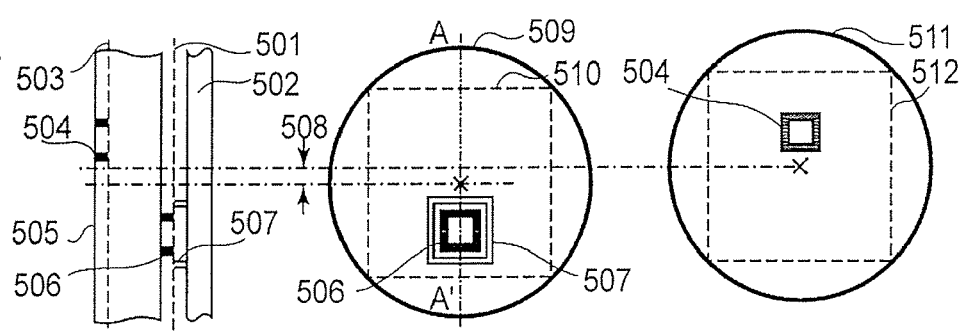
FIGS. 5A to 5C are schematic views for illustrating a method of alignment between a mold and a substrate by means of a reference substrate in Embodiment 2 of the present invention, wherein FIG. 5A includes views for illustrating a case wherein observation is made in a state in which the reference substrate is disposed at a predetermined position, FIG. 5B includes views for illustrating a case wherein observation is made in a stage in which the substrate is disposed at the second object position, and FIG. 5C includes views for illustrating a case wherein observation is made in a state in which the substrate is disposed at the first object position.
Figure 5B:
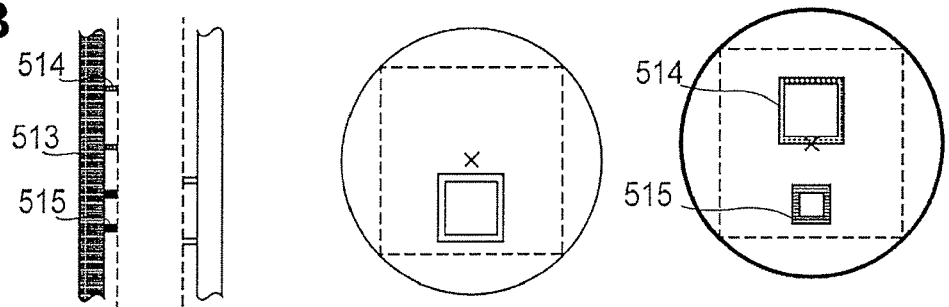
Figure 5C:
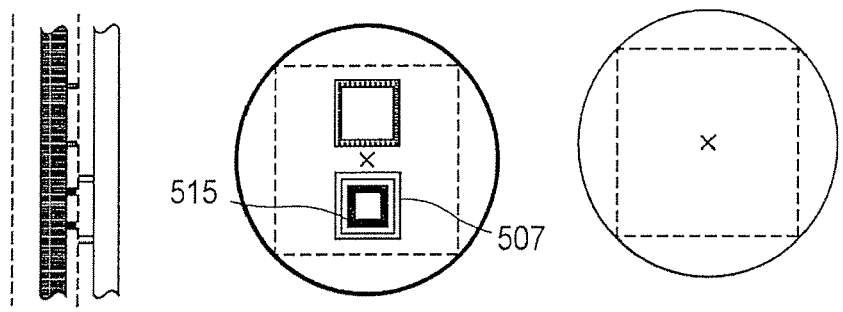

FIGS. 5A to 5C include schematic views for illustrating a mold of alignment between a mold 502 and a substrate 513.

In this embodiment, at both surfaces of a reference substrate 505, a first reference substrate mark 506 and a second reference substrate mark 504 are disposed, respectively. Further, an optical thickness of the reference substrate 505 is made equal to a distance between a first object position 501 and a second object position 503. Based on these features, it is possible to determine a position, to which a substrate mark should be moved at a second object position, in order to align the substrate mark with a desired position of a mold mark at a first object position, at one time, as described below.

FIG. 5A includes schematic views showing a case wherein the first reference substrate mark 506 of the reference substrate 505 is located at a first object position 501. Further, the second reference substrate mark 504 is located at a second object position 503. The first reference substrate mark 506 is disposed in a first image pickup range 510 provided in a first observation range 509. Further, the second reference substrate mark 504 is disposed in a second image pickup range 512 provided in a second observation range 511. Reference numeral 508 represents a difference between center positions in the first and second image pickup ranges 510 and 512.

First, the reference substrate 505 is disposed on a substrate holding portion (not shown) and, on the basis of a mold mark 507, alignment (positional adjustment) of the first reference substrate mark 506 is effected at the first object position 501 by an in-plane moving mechanism. More specifically, e.g., the alignment is effected so that the center of the first reference substrate mark 507 and the center of the mold mark 506 coincide with each other. At this time, at the second object position 503, the second reference mark 504 is located and an image thereof is stored.

Thereafter, the reference substrate 505 is removed from the substrate holding portion.

Next, a method of alignment of the substrate will be described. This method is basically identical to that in Embodiment 1.

More specifically, as shown in FIG. 5B, the substrate holding portion holding the substrate is disposed at a designated position (referred to as "F2-1") opposite to the mold by the in-plane moving mechanism. At this time, a first substrate mark 514 and a second substrate mark 515 are observed at the second object position. Then, alignment is effected so that the center of the first substrate mark 514 is aligned with the center of the reference substrate mark 504 observed at the second object position 503, shown in FIG. 5A, by using the in-plane moving mechanism. A difference (referred to as "E2-1") between the designated position (F2-1) of the substrate holding portion at this time and a designated position of the substrate holding portion after completion of the alignment (referred to as "S2-1") is stored.

FIG. 5C shows a state in which the substrate holding portion holding the substrate is raised, so that the first and second substrate marks 514 and 515 are disposed at the first object position 501. In this state, alignment between the mold and the substrate is ordinarily completed. Thereafter, imprint is effected by setting a designated position on the presumption that there is the difference (deviation) (E2-1) with respect to subsequent transfer onto the same substrate.

In the case wherein the mold and the substrate are deviated from each other and located outside a tolerable range, similarly, as in Embodiment 1, the second substrate mark 515 is positionally aligned on the basis of the mold mark 507 at the first object position 501, shown in FIG. 5C, by using the in-plane moving mechanism. In this case, the alignment at the second object position 503, shown in FIG. 5B, has already been effected, so that a degree of the positional deviation is not large. A difference (referred to as "E2-2") between the designated position (F2-1) of the substrate holding portion and a position of the substrate holding portion at the time of completion of the alignment (referred to as "S2-2") is stored. Thereafter, imprint is effected by setting a designated position on the presumption that there is the difference (deviation) (E2-2) with respect to subsequent transfer onto the same substrate.

Embodiment 3

In Embodiment 3, a method of alignment between the mold and the substrate, different in the image processing method from the alignment method of Embodiment 1, will be described.

In this embodiment, explanation of the alignment method common to FIGS. 1A to 1D is omitted, and only a different constitution thereof will be described.

Figure 6A:
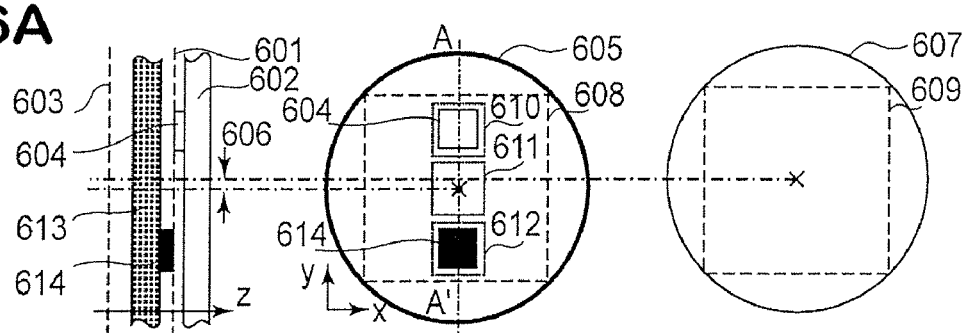
FIGS. 6A to 6D are schematic views for illustrating a signal processing method in Embodiment 3 of the present invention, wherein FIG. 6A includes views for illustrating a case wherein observation is made in a state in which the reference substrate is disposed at a first object position, FIG. 6B includes views for illustrating a case wherein observation is made in a state in which the substrate is disposed at the second object position, and FIG. 6D includes views for illustrating a case wherein observation is made in a state in which the substrate is disposed at the first object position.
Figure 6B:
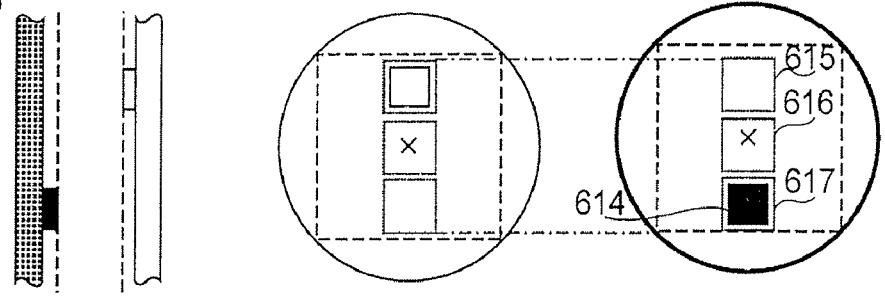
Figure 6C:
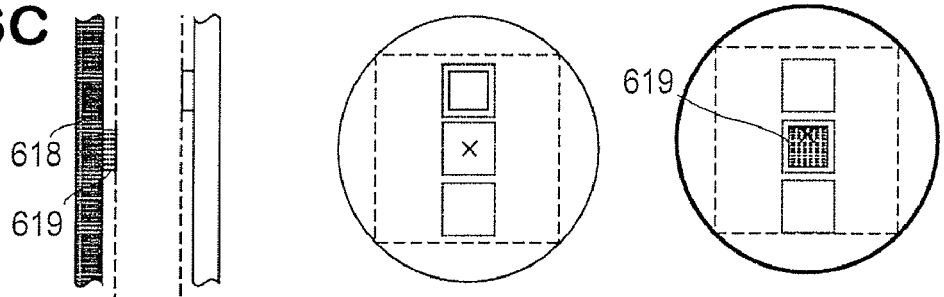

FIGS. 6A to 6C include schematic views for illustrating an image processing method in this embodiment.

First, the case in which a reference substrate 613 is observed at a first object position 601 will be described. FIG. 6A shows a state in which a reference substrate mark 614 of the reference substrate 613 is located at the first object position 601. In this embodiment, in a first image pickup range 608 in a first observation range 605, a first area A 610 is designated as an area including mark 604 of a mold 602 on the basis of the mold mark 604. Thereafter, a first area B 611 and a first area C 613 are designated with a certain distance (interval) between adjacent areas. The reference substrate mark 614 is positionally adjusted with respect to the first area C 613 by being moved by an in-plane moving mechanism. At this time, e.g., the first area C 613 is disposed at a desired position by effecting signal processing, such that the first area A 610 and the first area C 612 are selected or extracted from an image, subjected to contrast adjustment for each extracted image, and the two extracted images are superposed. After the alignment between the reference substrate mark 604 and the first area C 612 is completed, the reference substrate 613 is lowered by a substrate hoisting and lowering mechanism to a second object position 603 at which the reference substrate mark 604 is observed. A reference numeral 606 represents a difference between center positions in first and second image pickup ranges 608 and 609. FIG. 6B shows a state in which the reference substrate mark 604 of the reference substrate 613 is located at the second object position 603. In this state, in the second image pickup range 609 in a second observation range 607, a second area C 617 is designated on the basis of the reference substrate mark 604, so as to include the reference substrate mark 604. Thereafter, a second area B 616 and a second area A 615 are designated with a certain distance (interval) between adjacent areas. Thereafter, the reference substrate 505 is removed from the substrate holding portion.

Next, a method of alignment of the substrate will be described. FIG. 6C includes views for illustrating the case in which a substrate 618 is observed at the second object position 603.

More specifically, as shown in FIG. 6C, the substrate holding portion holding the substrate is disposed at a designated position (referred to as "F3-1") opposite to the mold by the in-plane moving mechanism. At this time, a substrate mark 619 is observed at the second object position. In this state, the second area B 616 is selected or extracted from an image and superposed on an image of the second area C 617 obtained in the operation described with reference to FIG. 6B, to effect positional adjustment. This positional adjustment can be performed at high speed, since the contact between the mold and the substrate is not generated at this time. Incidentally, the respective images are subjected to signal processing, such as contrast adjustment, or the like, in advance.

Next, the case wherein the substrate 618 is observed at the first object position 601 will be described.

Figure 6D:
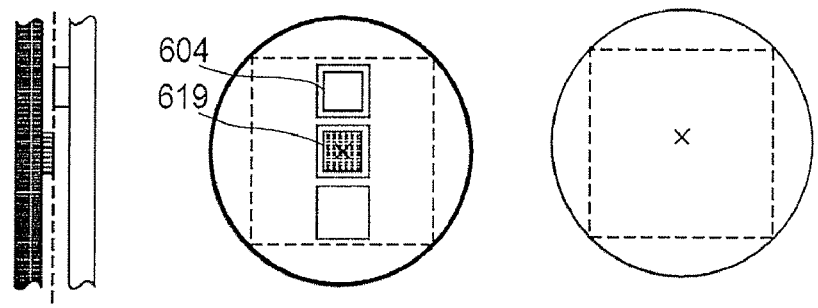

FIG. 6D shows a state in which the substrate 618 is raised in the positive direction of the Z-direction by the hoisting and lowering mechanism, to dispose the substrate mark 619 at the first object position 601. In this state, the alignment between the mold 602 and the substrate 618 is ordinarily completed, so that a resultant positional deviation is expected to be a level within a tolerable range. A difference (referred to as "E3-1") between the designated position (F3-1) of the substrate holding portion at this times, and a designated position of the substrate holding portion after completion of the alignment (referred to as "S3-1"), is stored. Thereafter, imprint is effected by setting a designated position on the presumption that there is the difference (deviation) (E3-1) with respect to subsequent transfer onto the same substrate.

In the case wherein the mold and the substrate are deviated from each other and located outside a tolerable range, similarly, as in Embodiment 1, the alignment between the mold 602 and the substrate 618 is finally effected at the first object position 601. In this case, the alignment at the second object position 603, shown in FIG. 6C, has already been effected, so that a degree of the positional deviation is not large. A difference (referred to as "E3-2") between the designated position (F3-1) of the substrate holding portion and a position of the substrate holding portion at the time of completion of the alignment (referred to as "S3-2") is stored. Thereafter, imprint is effected by setting a designated position on the presumption that there is the difference (deviation) (E3-2) with respect to the subsequent transfer onto the same substrate.

As described above, an effect of using different areas in the image pickup range of the image pickup device is that reflectances of the mold and the substrate are different from each other and, thus, the images of the mold and the substrate can be independently subjected to signal processing, to facilitate an increase in accuracy of alignment. Further, it is not necessary to consider an influence of mutual interference, since the mold and the substrate are not vertically overlaid on each other, so that a degree of freedom of the mark can be increased.

Next, a method of effecting high-accuracy alignment by generating moire fringes in the mark through image processing will be described.

FIGS. 7A to 7F are schematic views for illustrating alignment marks used when alignment is effected by image-processing moire fringes in Embodiment 3.

Figure 7A:
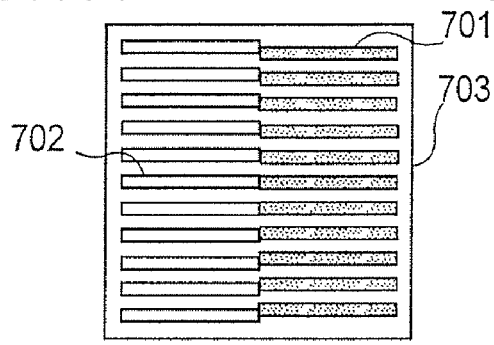

FIG. 7A shows a first mark including a bar pattern 701 with a pitch $P_1$ and a bar pattern 702 with a pitch $P_2$. FIG. 7B shows a second mark including the bar pattern 701 with the pitch $P_1$ and a bar pattern with the pitch $P_2$, wherein the bar patterns 701 and 702 have an arrangement opposite to that of the bar patterns 701 and 702 in the first mark shown in FIG. 7A. By mutually overlaying the first mark and the second mark, a composite image 706, as shown in FIG. 7C, is formed. In this composite image 706, left-hand and right-hand moire fringes are in phase with each other. FIG. 7C shows a state in which alignment between the mark and the substrate is completed.

Incidentally, in a state in which the alignment between the mark and the substrate is not completed, the left-hand and right-hand moire images are out of phase with each other. The moire fringes have a period equal to a pitch $P_M$ represented by the following equation:

$$P_M = \frac{P_1 P_2}{|P_1 - P_2|}$$

As described above, a positional deviation between the mold and the substrate is enlarged without using optical magnification.

Figure 7D:
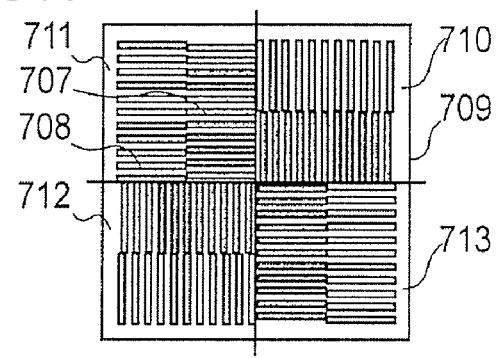
Figure 7B:
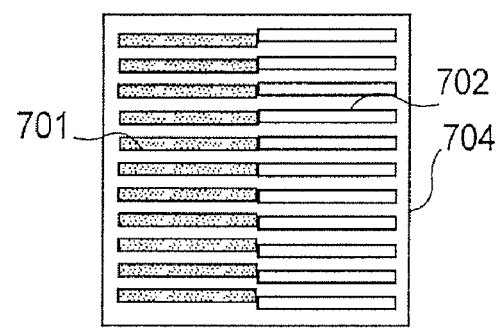
Figure 7E:
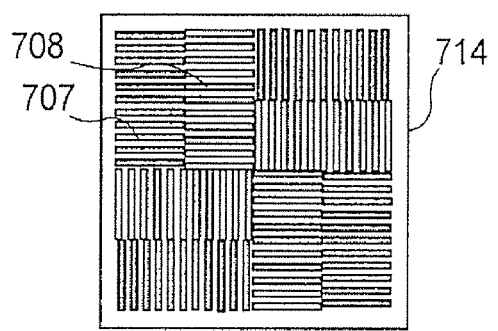
Figure 7C:
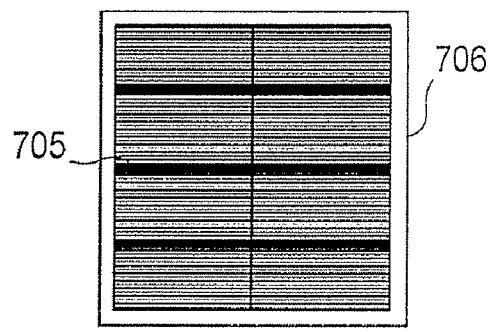
Figure 7F:
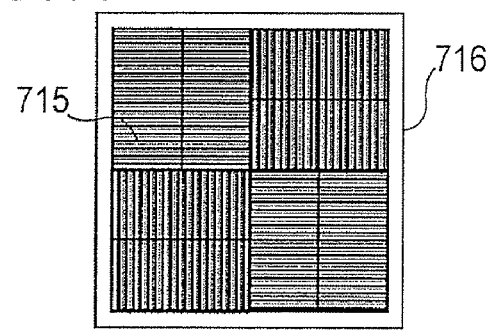

Then, the moire fringes are arranged to constitute a first mark 709 for XYθ measurement, as shown in FIG. 7D, wherein the first mark 709 includes a first area 710, a second area 711, a third area 712, a fourth area 713, a pattern 707 with a pitch $P_3$, and a pattern 708 with a pitch $P_4$. Further, the moire fringes are arranged to constitute a second mark 714 for XYθ measurement, as shown in FIG. 7E, wherein the second mark 714 includes the first to fourth areas 710-713 and the patterns 707 and 708, which are arranged opposite to those in FIG. 7D. With respect to the first mark 709 shown in FIG. 7D and the second mark 714 shown in FIG. 7E, alignment for the y-direction and θ direction can be effected in the first and third areas 710 and 712, and alignment for the x-direction and θ direction can be effected in the second and fourth areas 711 and 713. FIG. 7F shows a composite image 716 for XYθ measurement, including moire fringes 715 for XYθ measurement at the time after the alignment is completed.

The above-described apparatuses and method according to the present invention can be utilized in manufacturing technologies, and the like, of semiconductors, optical devices, such as photonic crystals, and the like, and biochips, such as u-TAS, and the like.

Embodiment 4

In Embodiment 4, another embodiment of the optical system described in Embodiment 1 will be described. Particularly, this embodiment is suitable for the contrast adjustment described in Embodiment 3. This is because, when images of marks of a mold and a substrate different in reflectance are picked up in the same field of view, a sufficient contrast cannot be ensured to disturb accurate measurement in some cases.

Accordingly, it is important that the marks are disposed at positions so that the marks do not optically adversely affect each other, to be independently adjusted in contrast for each of the marks, when the marks are viewed from a vertical direction.

The reason for the vertical direction is that the mark or the substrate is moved in the Z-direction and, thus, a change in position of the marks in the image pickup device due to the movement of the mark or the substrate is required to be prevented. For this reason, when the marks are obliquely observed, a signal processing method is required to correspond to the positional change of the marks.

The mold mark has a high transmittance, so that the mold mark is liable to have a contrast lower than that of the substrate mark.

Generally, measurement accuracy is improved with an increase in contrast, so that such an adjustment, which contrasts on the mold and the substrate are maximum values, respectively, is required.

Next, a measurement optical system in this embodiment will be described with reference to FIGS. 8A to 8B, each showing a constitution of the measurement optical system.

Figure 8A:
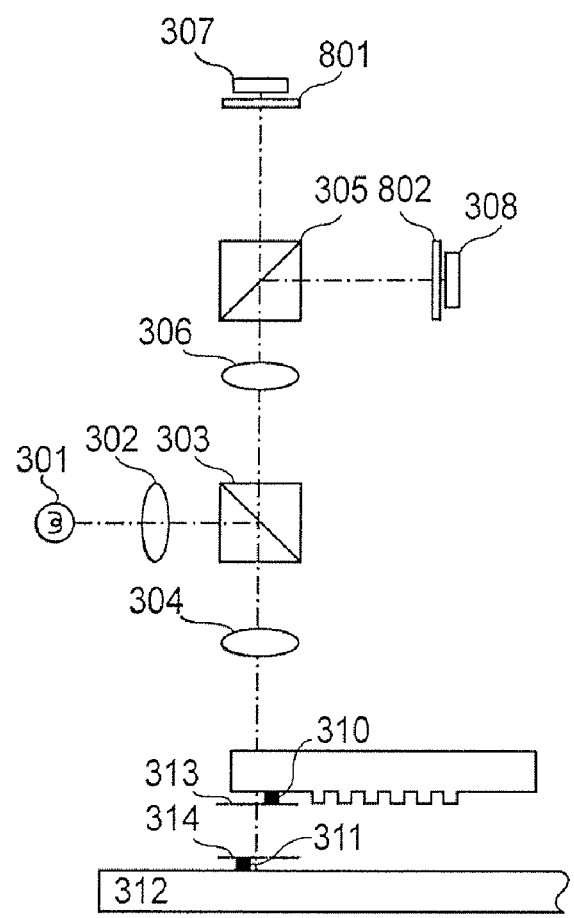

FIG. 8A shows a constitution in which a first optical device 801 and a second optical device 802 are disposed in front of a first image pickup device 307 and a second image pickup device 308, respectively. Each of the optical devices is constituted by a color filter, an interference filter, an ND (neutral-density) filter, a polarizer, and a combination thereof. The first and second optical devices are suitably selected depending on the reflectances. It is also possible to use color filters of a color CCD (charge coupled device) as they are.

Figure 8B:
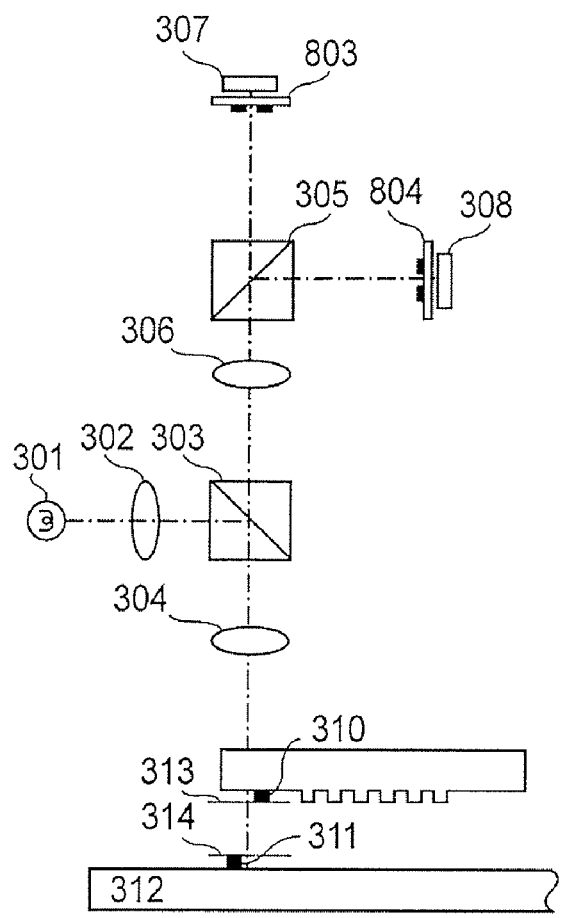

FIG. 8B shows a constitution in which light reaching respective positions of the image pickup devices is adjusted by first and second optical devices 803 and 804. In this case, the first optical device 803 and the second optical system 804, which are different in characteristic depending on position, are disposed in image pickup ranges of the first image pickup device 307 and the second image pickup device 308, respectively, so as to adjust a contrast depending on the position. In this constitution, alignment can be effected at a first object position and a second object position. Further, it is possible to easily effect alignment by directly using a mold mark and a substrate mark, even in the case wherein reflectances of the mold and the substrate are different from each other when the substrate mark is located at the first object position.

Figure 9A:
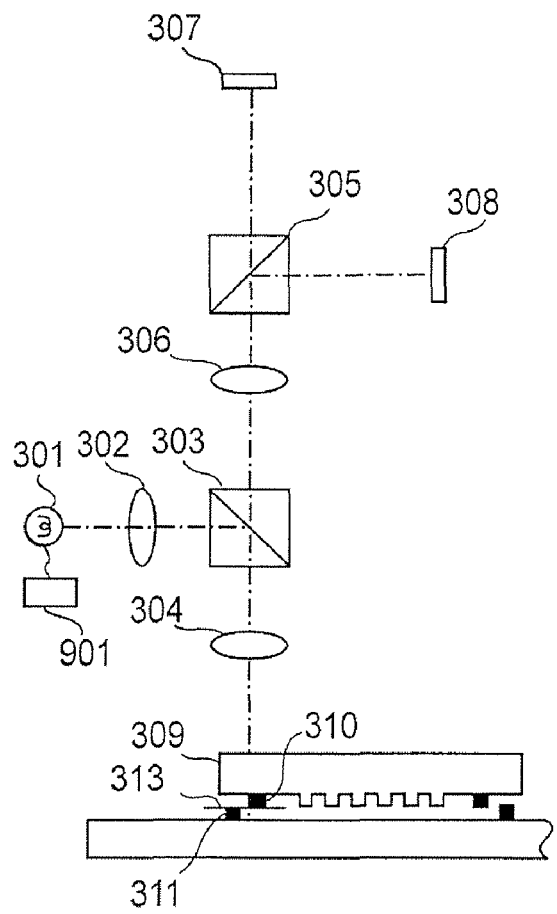

FIG. 9A shows a constitution of an optical system in which a light amount control mechanism 901 for adjusting an amount of light in correspondence with each of marks for the mark and the substrate is used in order to effect contrast adjustment.

Figure 9B:
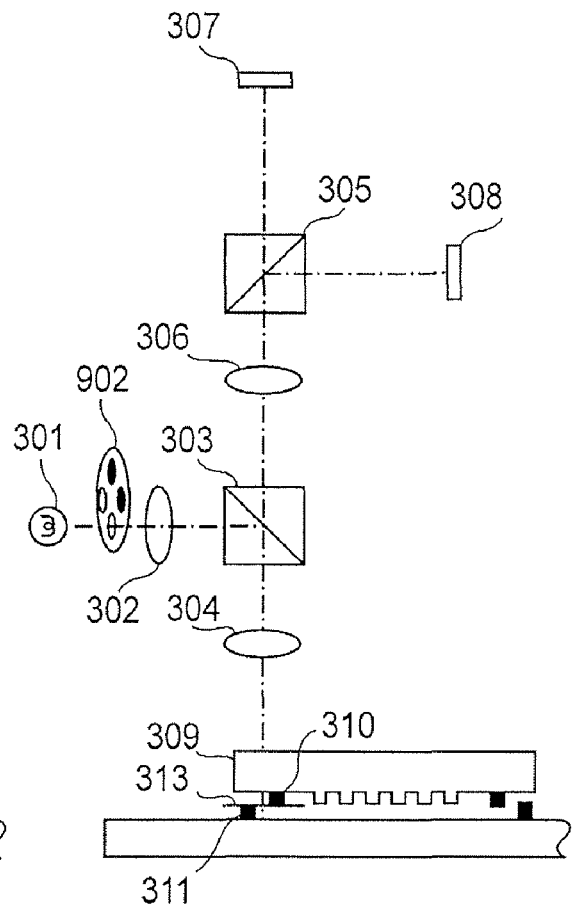

In a constitution shown in FIG. 9B, a rotary shutter 902 is used for changing an amount of light from a light source 301. Depending on reflectances of the mold and the substrate, a shutter position of the rotary shutter 902 is switched.

In the optical systems shown in FIGS. 9A and 9B, images of the mold mark and the substrate mark are picked up at a first light amount and a second light amount, respectively, so that image pickup is effected two times by dividing an image pickup operation into a first operation and a second operation.

The image pickup operation may be effected by changing the light amount as described above, or changing exposure times or gains of the image pickup devices, depending on characteristics of the mold and the substrate.

Figure 10A:
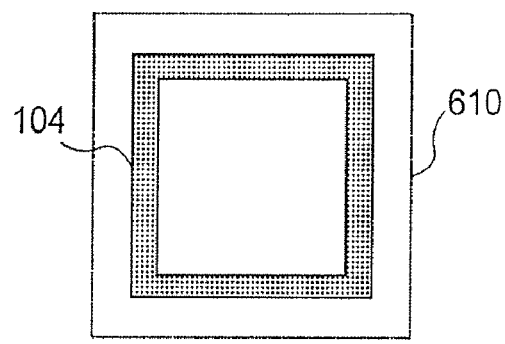
Figure 10B:
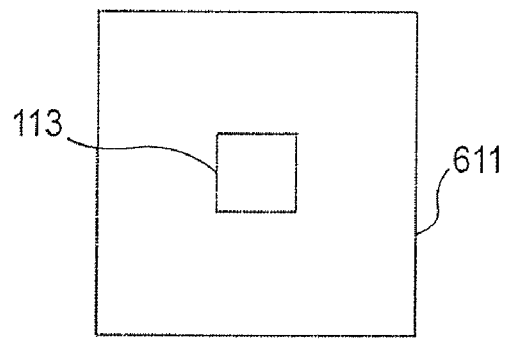

FIGS. 10A and 10B show embodiments of marks used for alignment between a mold and a substrate in an alignment method of a box-in-box type. In these figures, the image pickup device has a first area A 610 in which a mold mark 104 is provided to the mold and a second area B 611 in which a substrate mark 113 is provided to the substrate. Since the optical system of this embodiment is used, reflectances at the positions of the mold mark 104 and the substrate mark 113 are optimized.

Figure 10C:
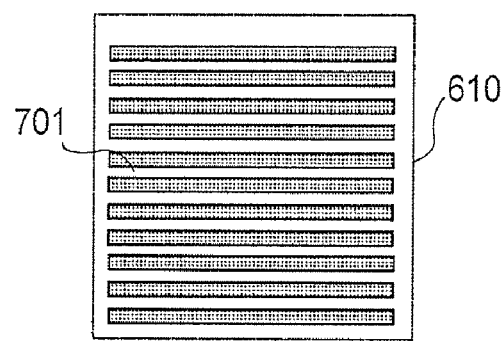
Figure 10D:
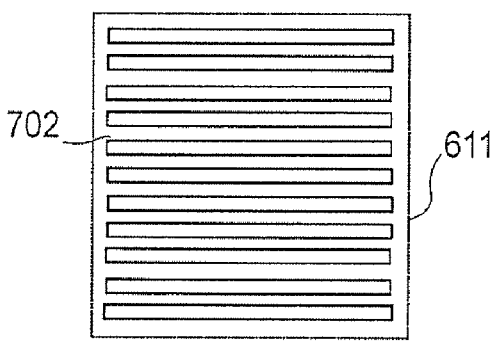

FIGS. 10C to 10D show a constitution of a grating-type mold mark 701 in a first area A 610 of the mold and a constitution of a grating-type substrate mark 702 in a second area B 611 of the substrate, respectively. These constitutions are particularly suitable for the case in which alignment on the order of nanometers is effected. Since the optical system of this embodiment (Embodiment 4) is used, reflectances of the mold and the substrate are optimized.

Figure 11A:
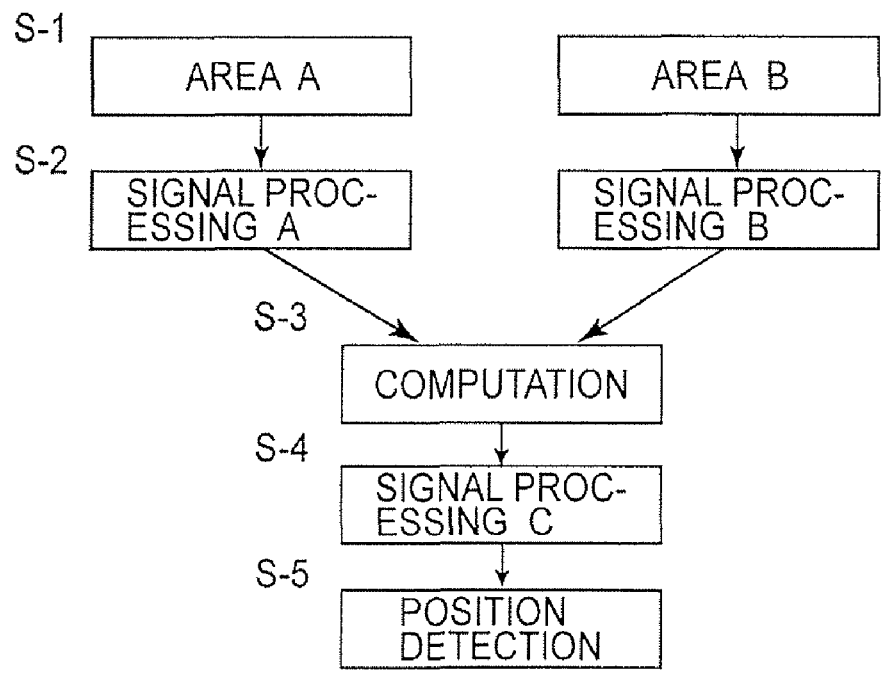
Figure 11B:
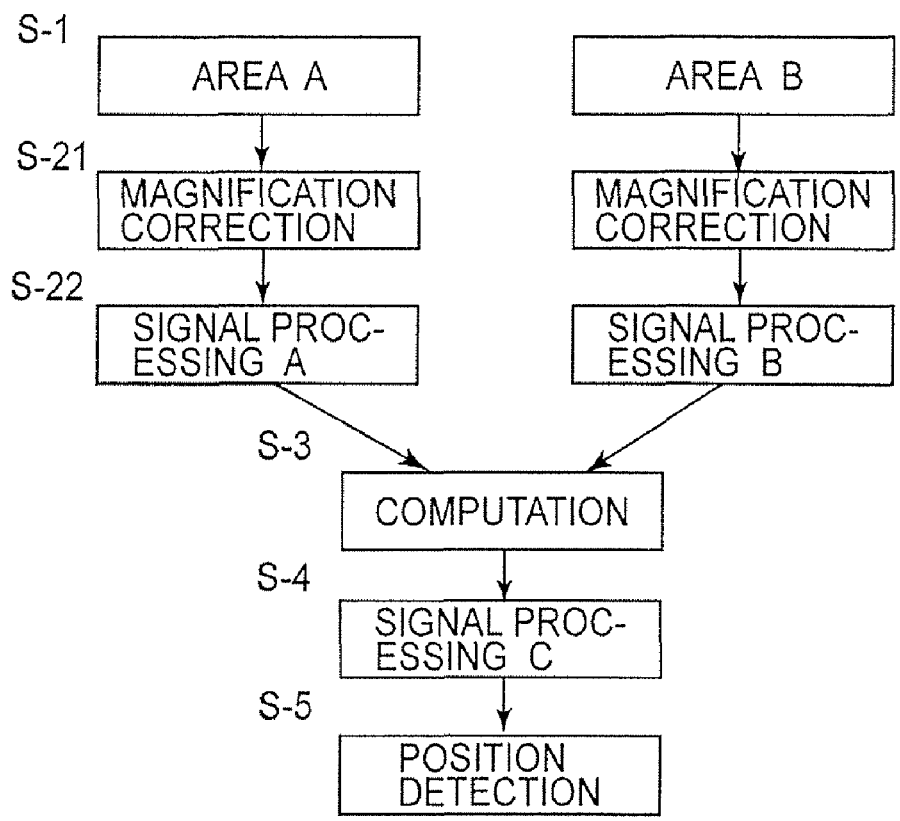

Next, a signal processing method in this embodiment will be described with reference to FIGS. 11A and 11B, showing flow charts for illustrating the signal processing method.

FIG. 11A is a flow chart for illustrating the case in which magnification correction is not effected.

Referring to FIG. 11A, images of the first area A and the second area B are obtained in step S-1. It is desirable that the first area A and the second area B have the same size (area). This is because, in many cases, the number of samplings for FFT (fast Fourier transform) analysis in the first area A is equal to that in the second area B.

In the case in which the area of the first area A is different from that of the second area B, it is necessary to effect such a processing that data at a peripheral portion are extended, as they are, so as to cause the first and second areas A and B to have the same area.

Next, in Step S-2, signal processing A is effected in the first area A and signal processing B is effected in the second area B. Each of the signal processings A and B is ordinary filtering using a low-pass filter, a high-pass filter, a band-pass filter, an FFT-filter, a smoothing filter, a differential filter, etc. Further, gain adjustment is effected so as to optimize a contrast depending on the reflectances of the mold and the substrate, and the like, factors.

Next, in step S-3, computation is performed. The computation may be performed by effecting addition of images, multiplication of images, calculation of a difference between images, or calculation of images using other functions.

Next, in Step S-4, signal processing C is performed by using a filter similar to those used in step S-2.

Finally, in step S-5, detection of a position is made.

FIG. 11B is a flow chart showing the case in which the step S-2, in the case shown in FIG. 11A, is divided into step S-21 for performing magnification correction and step S-22 for performing signal processing A and signal processing B. Particularly, in the imprint, a height of the mold or the substrate is changed. In correspondence therewith, an optical magnification is also changed. In such a case, there is a possibility that high-accuracy alignment cannot be effected when magnification correction is not made. A method of making the magnification may, e.g., be one wherein a distance between adjacent bars is compared with a designed value thereof, and a coefficient is changed, so that the distance coincides with the designed value. Incidentally, the signal processings, in step S-2 and the subsequent steps, may be performed by using two-dimensional data or by converting the two-dimensional data into one-dimensional data.

In this embodiment, the case of using the two (first and second) areas is described, but it is also possible to use three or more areas.

Next, an example of signal processing, in the case in which the mold mark shown in FIG. 10A and the substrate mark shown in FIG. 10B are used in the above-described signal processing in this embodiment, will be described.

First, in step S-1, images of the area A and the area B are obtained. In step S-2, magnification correction and filtering using the smoothing filter in each of the area and the area B area are effected to reduce noise. Further, contrasts of the areas A and B are adjusted. In step S-3, the images of the areas A and B after the signal processing are added. This state is similar to that in the case of optical overlaying (superposition). In step S-4, further signal processing using the smoothing filter, or the like, is effected. In step S-5, the position is detected.

Incidentally, as the method of signal processing, other than the above-described method, it is also possible to directly determine centers of gravity of the marks in the areas A and B in step S-2. Further, in step S-3, a difference between the centers of gravity is calculated. In step S-4, the signal processing is not particularly effected. In step S-5, the difference is converted into a distance between the mold and the substrate. A condition of completion of the alignment is such that the difference is zero. The method described above may also be applicable to this embodiment.

Next, an example of signal processing in the case wherein the mold mark, having a periodic structure shown in FIG. 10C, and the substrate mark, having a periodic structure shown in FIG. 10D, are used in the above-described signal processing in this embodiment, will be described.

First, in step S-1, images of the areas A and B are obtained. In step S-2, magnification correction and conversion of the two-dimensional data into one-dimensional data by effecting averaging processing are made. Further, by using the FFT filter, components of basic frequencies of the periodic structures are obtained. In step S-3, the resultant values are multiplied mathematically. This multiplication is represented by the following equation.

$$\sin\left(\frac{2\pi}{P_1}x\right) \times \sin\left\{\frac{2\pi}{P_2}(x+\delta)\right\} = \frac{1}{2}\left[-\cos\left\{\frac{2\pi}{P_1}x + \frac{2\pi}{P_2}(x+\delta)\right\} + \cos\left\{\frac{2\pi}{P_1}x - \frac{2\pi}{P_2}(x+\delta)\right\}\right]$$

In the above equation, $\delta$ represents a positional deviation and the second term of the right side represents a component of moire fringes.

In step S-4, by the FFT, it is possible to simply divide the right side into the first term representing a low-frequency component and the second term representing a high-frequency component. As a result, as the component of moire fringes, the following term can be extracted.

$$\cos\left\{2\pi\left(\frac{1}{P_1} - \frac{1}{P_2}\right)x - \frac{2\pi}{P_2}\delta\right\}$$

In step S-5, the following phase component is extracted.

$$-\frac{2\pi}{P_2}\delta$$

From the phase component, it is possible to detect $\delta$ associated with the position.

In the alignment (positional adjustment), a condition of completing the alignment is taken as a time at which the phase component is zero in many cases.

Incidentally, as the grating-type marks, it is possible to use the grating type marks 703 and 704, shown in FIGS. 7A and 7B, with different pitches. More specifically, these marks are disposed in parallel to each other and from each of basic frequencies of the gratings, two sets of moire fringes with the same pitch are generated. By using these moire fringes, it is also possible to effect the alignment between the mold and the substrate.

Incidentally, an essential difference between the overlaying (superposition) of patterns, such as grating pattern, or the like, in the original processing of this embodiment and optical overlaying (superposition) will be described below.

The former (signal processing) overlaying is an ideal state, but the latter (optical) overlaying is adversely affected by multiple reflections, or the like. Particularly, in the case wherein the mold and the substrate have different reflectances, the optical overlaying is adversely affected by the multiple reflections. Accordingly, depending on a detection algorithm, an error occurs in measurement in some cases. For this reason, as in this embodiment, the signal processing overlaying is important in order to obtain ideal signals to result in a less frequent occurrence of error by using the marks with grating patterns, which do not coincide with each other when the patterns are observed in the vertical direction.

Incidentally, in order to increase the contrast, it is preferable from the viewpoint of improvement in contrast that a transmission wavelength range of a filter provided to the light source or the image pickup devices is changed, depending on a gap between the mold and the substrate.

For example, in the case of an imprint method in which a pattern formed on a processing surface of the mold is transferred by curing a resin material disposed on the surface of the substrate, the change in wavelength range is made in the following manner.

When an alignment mark provided to the mold is observed through the image pickup device, a wavelength of light entering the image pickup device is controlled depending on the gap between the mold and the substrate or a thickness of a member constituting the alignment mark. More specifically, in the imprint method, the resin material, onto which the pattern is to be transferred, is interposed between the mold and the substrate. In the case wherein refractive indices of the resin material and the mold are close to each other, a phenomenon, which is called index matching, such that the alignment mark including projections and recessed formed on the mold disappears, is caused to occur. In an actual observation, it is difficult to perform the observation of the alignment mark for the mold.

In order to obviate the index matching by which the mold mark disappears, it is effective to use a mark formed of a high-refractive index material.

However, in the imprint method, the gap between the mold and the substrate can be several tens of nanometers to several hundreds of nanometers. In such a case, the contrast of the mark can be lowered by an interference effect of light, thus requiring further improvement.

The reason why the use of the high-refractive index material for the mold imprint (particularly, at the alignment mark option) is preferable, will be described.

Assuming that the mold mark is constituted by $SiO_2$ having a refractive index of 1.45, resin materials having a refractive index of 1.5, and SiN having a refractive index of 2.0, a reflectance R at an interface between materials having refractive indices $n_1$ and $n_2$ is represented by the following equation.

$$R = \left(\frac{n_1 - n_2}{n_1 + n_2}\right)^2$$

Accordingly, a reflectance R at an interface between $SiO_2$ and the resin material is:

$$R = 2.9 \times 10^{-4}.$$

This value is very small. When the mark is observed, the mark is less observable due to the above-described index matching.

On the other hand, a reflectance R at an interface between SiN and the resin material is:

$R=2.0\times10^{-2}$.

This value is larger than that at the interface between $SiO_2$ and the resin material by about two digits. Here, a reflectance R at an interface between $SiO_2$ and air is:

$R=3.4\times10^{-2}$.

As described above, it is found that the reflectance is largely improved by using SiN as the material for the mold mark.

Incidentally, in the imprint method, the gap between the mold and the substrate and the thickness of the film of the high-refractive index material can be several tens of nanometers to several hundreds of nanometers. In such a case, the light interference effect is remarkably obtained.

Figure 12:
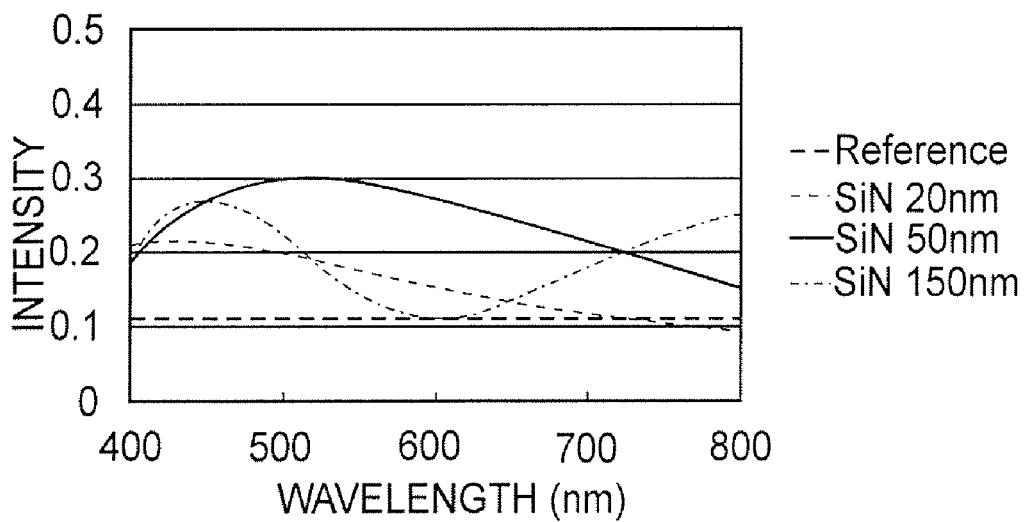
FIGS. 12 and 13 are graphs, each showing a relationship between a wavelength and an intensity of light entering an image pickup portion.

FIG. 12 is a graph showing a relationship between a wavelength and a reflected light intensity in the case in which the mold mark has a four-layer structure including layers of $SiO_2$, SiN, a resin material (thickness (gap): 100 nm), and Si, and thickness of SiN layer is variable. More specifically, FIG. 12 shows a result of simulation with the four-layer structure including an Si layer having an infinite thickness, a 100 nm-thick resin material layer formed on the Si layer, an SiN layer (thickness: 20 nm, 50 nm, 150 nm) formed on the resin material layer, and an $SiO_2$ layer, which has an infinite thickness and is disposed on the SiN layer.

Calculation of values is made by using a model for Fresnel reflection. As a reference, a three-layer structure including three layers ($SiO_2$ layer/resin material layer/Si layer) prepared by omitting the SiN layer from the above-described four-layer structure is employed.

A resultant contrast when the marks is observed is better with a larger difference between the four-layer structure, including the SiN layer, and the three-layer (reference) structure, lacking the SiN layer.

For example, at the wavelength of 600 nm, a reflected light intensity is 0.27 when the SiN layer has a thickness of 50 nm and is 0.11 when the SiN layer has a thickness of 150 nm. The reference structure provides a reflected light intensity of 0.11 at the wavelengths of 400-800 nm, so that a contrast at the wavelength of 600 nm is increased in the order of the SiN layer thicknesses of 150 nm, 20 nm, and 50 nm. At the wavelength of 800 nm, a contrast is increased in the order of 20 nm, 50 nm, and 150 nm (SiN layer thickness). Further, at the wavelength of 400 nm, a contrast is highest at the SiN layer thickness of 20 nm.

Figure 13:
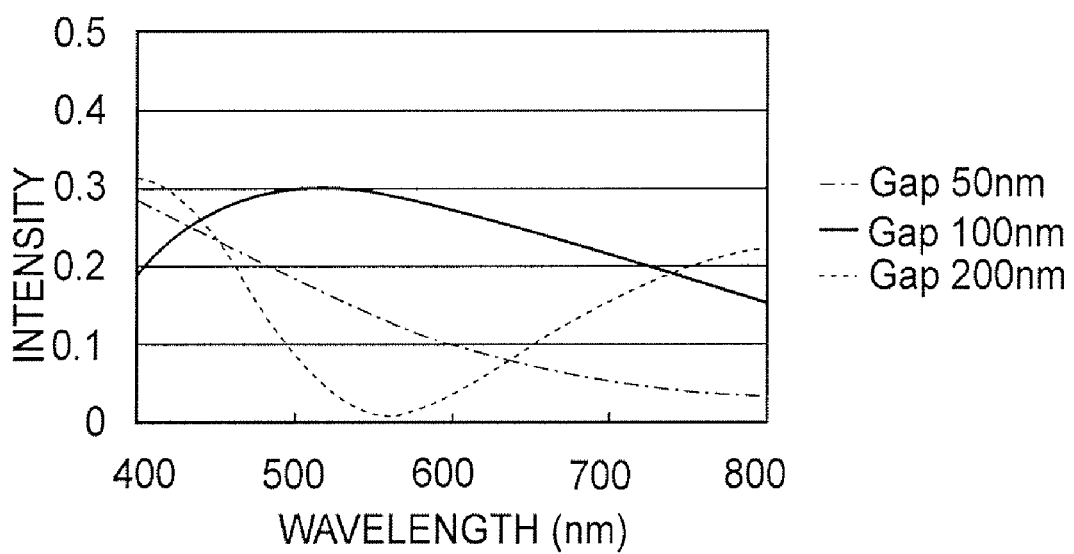

FIG. 13 is a graph showing a relationship between a wavelength and a reflected light intensity in the case in which the mold mark has a four-layer structure including layers of $SiO_2$, SiN (thickness: 50 nm), a resin material, and Si, and a thickness of the resin material layer as a gap layer is variable. More specifically, values of the thickness (gap) are 50 nm, 100 nm, and 200 nm.

When the reflected light intensities at the wavelength of 600 nm are compared, the intensity values are 0.273 for the gap (resin material layer thickness) of 100 nm, 0.099 for the gap 50 nm, and 0.033 for the gap of 200 nm. Since the intensity of the reference structure is 0.11 at the wavelengths of 400-800 nm (FIG. 12), a contrast at the wavelength of 600 nm is increased in the order of the gaps of 50 nm, 200 nm, and 100 nm. A contrast at the wavelength of 500 nm is increased in the order of the gaps of 200 nm, 50 nm, and 100 nm. Further, a contrast at the wavelength of 800 nm is increased in the order of the gaps of 100 nm, 50 nm, and 200 nm.

As described above, the reflectance is changed depending on the wavelength in the case in which the SiN layer thickness or the gap (resin material layer thickness) is several tens of nanometers to several hundreds of nanometers (a fraction of the wavelength of light for observation to several times the wavelength of light for observation). For this reason, it is desirable that the wavelength of light entering the image pickup device is controlled depending on the SiN layer thickness or the gap.

Incidentally, when spectra of light entering the image pickup device are in a range of 400-800 nm, a contrast is determined by a difference between an average of the spectra in this range and the reference (intensity: 0.11).

Next, an alignment method will be described.

In the alignment, accuracy of alignment is improved with an increase in contrast of the mold mark. An observation wavelength of the mark, in the case in which alignment is effected while bringing the mold and the substrate near to each other, will be described. The SiN layer has a thickness of 50 nm in this case. When the gap is 200 nm, the mark is observed at the wavelength of 400-450 nm. When the gap is 100 nm in a further approximated state, the mark is observed at the wavelength of 500-550 nm. When the gap is 50 nm in a still further approximated state, the mark is observed at the wavelength of 400-450 nm. Even when the gap is another value, the mark is observed at an optimum wavelength.

A method of selecting the wavelength may be a method using a color filter or a method using a plurality of laser beams. The color filter may be disposed on the illumination optical system side or the image pickup device side.

For example, in the above-described embodiments and Embodiments 1-4, in the case in which optical information is inputted into the image pickup device through a wavelength filter, it is possible to always obtain information about an image having a high contrast by changing a transmission wavelength range of the wavelength filter, depending on the gap. Further, in an imprint apparatus for transferring a pattern formed on a processing surface of a mold by curing a resin material in a substrate surface, it is preferable that the apparatus includes an image pickup device for observing the mold and a means for controlling a wavelength of light entering the image pickup device, depending on a gap between the mold and the substrate. The means for controlling the wavelength is constituted by the color filter or a plurality of light sources (capable of outputting light fluxes at a plurality of wavelengths).

As described above, according to the present invention, the mold or the substrate is less liable to be broken during the imprint, and it is possible to effect the alignment at high speed. Further, the illumination optical system can be simplified, so that it is possible to reduce overall cost of the apparatus.

While the invention as been described with reference to the structures disclosed herein, it is not confined to the details set forth, and this application is intended to cover such modifications or changes as may come within the purpose of the improvements, or the scope of the following claims.

What is claimed is:

1. A pattern transfer apparatus for transferring an imprint pattern formed on a mold, provided with an alignment mark, to a resin material on a substrate, provided with an alignment mark, alignment of the mold and the substrate with each other being performed in an in-plane direction that includes an x-direction and a y-direction, the apparatus comprising:

(a) a first image pickup device for obtaining an image of an object positioned at a first object position;

(b) a second image pickup device for obtaining an image of an object positioned at a second object position, spaced apart from the first object position in a z-direction orthogonal to the in-plane direction, the second object position being more distant from the alignment mark of the mold than the first object position; and (c) an optical system configured to form an image of an object positioned at the first object position and an image of an object positioned at the second object position, wherein the apparatus is configured such that:

(i) the alignment mark of the mold and an alignment mark of a reference substrate are positioned at the first object position to observe the alignment mark of the mold and the alignment mark of the reference substrate through the first image pickup device and to align the alignment mark of the mold and the alignment mark of the reference substrate with each other, (ii) in a state in which the alignment mark of the mold and the alignment mark of the reference substrate are aligned with each other, the alignment mark of the reference substrate is positioned at the second object position to observe the alignment mark of the reference substrate through the second image pickup device to obtain first information about a difference in the in-plane direction between a position of an image of the alignment mark of the reference substrate observed through the first image pickup device and a position of an image of the alignment mark of the reference substrate observed through the second image pickup device, (iii) the alignment mark of the substrate is positioned at the second object position to observe the alignment mark of the substrate through the second image pickup device to obtain second information about a position of an image of the alignment mark of the substrate in the in-plane direction, and (iv) the alignment is performed based on the obtained first and second information to transfer the imprinting pattern to the resin material.

2. An apparatus according to claim 1, wherein the second object position is a position at which the mold and the resin material on the substrate do not contact each other.

3. An apparatus according to claim 1, wherein the reference substrate is provided with the alignment mark in each of both surfaces thereof, the reference substrate having an optical thickness equal to a distance between the first object position and the second object position in the z-direction.

4. An apparatus according to claim 1, wherein the alignment mark of the reference substrate is disposed in an area having a size equal to that of a pattern area of the mold.

5. An apparatus according to claim 1, wherein the substrate to which the imprinting pattern is to be transferred is used as the reference substrate.

6. An apparatus according to claim 1, wherein the alignment is performed in a state in which the substrate is positioned at the second object position.

7. An apparatus according to claim 1, further comprising a light amount adjusting mechanism configured to adjust an amount of light entering each of the first and second image pickup devices.

8. An apparatus according to claim 7, wherein the light amount adjusting mechanism is configured so that the amount of light is adjustable in accordance with a plurality of image pickup areas of the first and second image pickup devices.

9. A pattern transfer method of transferring an imprint pattern formed on a mold, provided with an alignment mark, to a resin material on a substrate, provided with an alignment mark, alignment of the mold and the substrate with each other being performed in an in-plane direction that includes an x-direction and a y-direction, the method comprising:

positioning an alignment mark of the mold and an alignment mark of a reference substrate at a first object position to observe the alignment mark of the mold and the alignment mark of the reference substrate through a first image pickup device configured to obtain an image of an object positioned at the first object position, the image being formed by an optical system, and to align the alignment mark of the mold and the alignment mark of the reference substrate with each other;

positioning, in a state in which the alignment mark of the mold and the alignment mark of the reference substrate are aligned with each other, the alignment mark of the reference substrate at a second object position, to observe the alignment mark of the reference substrate through a second image pickup device configured to obtain an image of an object positioned at the second object position spaced apart from the first object position in a z-direction orthogonal to the in-plane direction, the second object position being more distant from the alignment mark of the mold than the first object position, the image of the object positioned at the second object position being formed by the optical system, and to obtain first information about a difference in the in-plane direction between a position of an image of the alignment mark of the reference substrate observed through the first image pickup device and a position of an image of the alignment mark of the reference substrate observed through the second image pickup device;

positioning the alignment mark of the substrate at the second object position to observe the alignment mark of the substrate through the second image pickup device and to obtain second information about a position of an image of the alignment mark of the substrate in the in-plane direction; and performing the alignment based on the obtained first and second information to transfer the imprinting pattern to the resin material.

* * * * *